(12) United States Patent
Mooring et al.

(10) Patent No.: US 6,502,054 B1
(45) Date of Patent: Dec. 31, 2002

(54) METHOD OF AND APPARATUS FOR DYNAMIC ALIGNMENT OF SUBSTRATES

(75) Inventors: Benjamin W. Mooring, Austin, TX (US); Charles W. Freund, Austin, TX (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/470,780

(22) Filed: Dec. 23, 1999

Related U.S. Application Data
(60) Provisional application No. 60/167,262, filed on Nov. 22, 1999.

(51) Int. Cl.[7] .................................................. G01C 3/00
(52) U.S. Cl. ........................................ 702/150; 702/149
(58) Field of Search ................................ 702/149, 150; 700/218; 414/754; 73/865; 187/267

(56) References Cited

U.S. PATENT DOCUMENTS

| | | | | |
|---|---|---|---|---|
| 4,819,167 A | | 4/1989 | Cheng et al. ............ 364/67.01 |
| 4,833,790 A | | 5/1989 | Spencer et al. ............... 33/520 |
| 4,871,955 A | | 10/1989 | Berger ......................... 318/640 |
| 4,980,626 A | | 12/1990 | Hess et al. ............. 318/568.16 |
| 5,483,138 A | * | 1/1996 | Shmookler et al. .... 318/568.16 |
| 5,769,952 A | | 6/1998 | Komino ...................... 118/733 |
| 5,980,194 A | * | 11/1999 | Freerks et al. .............. 414/754 |
| 6,102,164 A | * | 8/2000 | McClintock et al. ....... 187/267 |
| 6,244,121 B1 | * | 6/2001 | Hunter ....................... 73/865.9 |
| 6,256,555 B1 | | 7/2001 | Bacchi et al. ............... 700/245 |
| 6,279,724 B1 | | 8/2001 | Davis ....................... 198/465.2 |
| 6,298,280 B1 | * | 10/2001 | Bonora et al. ............... 700/218 |
| 6,360,144 B1 | | 3/2002 | Bacchi et al. ............... 700/250 |
| 6,405,101 B1 | | 6/2002 | Johanson et al. ........... 700/218 |

FOREIGN PATENT DOCUMENTS

| | | | |
|---|---|---|---|
| EP | 0508748 | 10/1992 | ........... H01L/21/00 |
| GB | 2180097 | 3/1987 | ........... H01L/21/68 |

OTHER PUBLICATIONS

W. Press, S. Teukolsky, W. Vetterling and B. Flannery, "*Numerical Recipes.111 C*", pp. 408–412, 1988, 1997, © Cambridge University Press, New York, NY.

* cited by examiner

*Primary Examiner*—Marc S. Hoff
*Assistant Examiner*—Felix Suarez
(74) *Attorney, Agent, or Firm*—Martine & Penilla, LLP

(57) ABSTRACT

A wafer is transported on a blade of a robot along a path through a port into a module of semiconductor manufacturing equipment. The port has a transverse axis intersecting the path. Dynamic alignment uses two through-beam sensors positioned along the transverse axis to determine the position of the center of the wafer with respect to the center of the blade as the wafer is transported. Positioning of the sensors according to latency characteristics of the sensors assures that the moving wafer will break or make a beam of a first of the sensors and that the first sensor will generate a first transition signal before the moving wafer will break or make a beam of a second of the sensors and before the second sensor generates a second transition signal. The dynamic alignment may be performed with respect to wafers having different sizes.

29 Claims, 16 Drawing Sheets

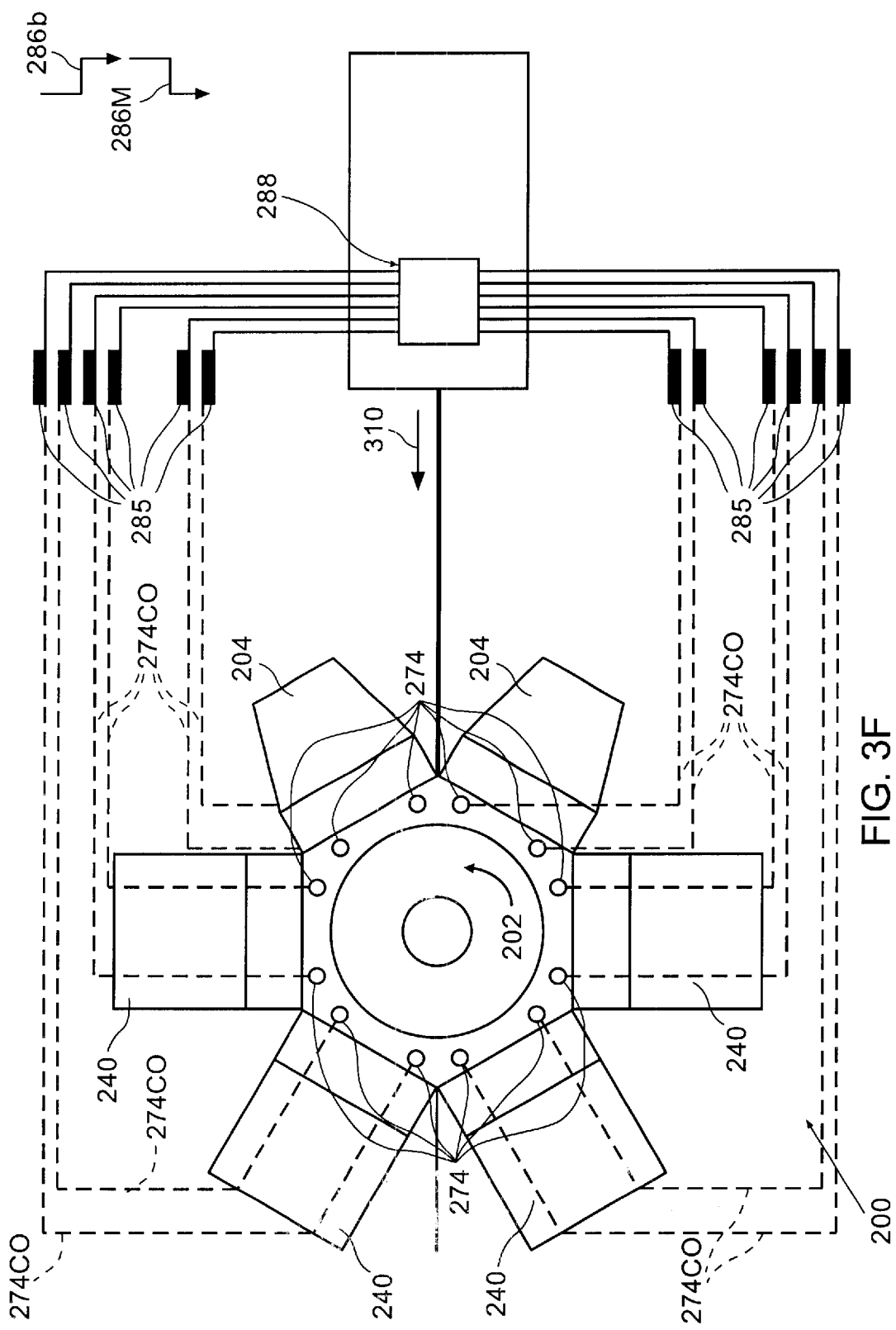

METHOD OF AND APPARATUS FOR DYNAMIC ALIGNMENT OF SUBSTRATES

CROSS REFERENCE To RELATED APPLICATIONS

This application claims priority from U.S. Provisional Patent Application No. 60/167,262 (Attorney Docket No. LAM2P132+), filed Nov. 22, 1999, and entitled "Substrate Dynamic Alignment." This provisional application is herein incorporated by reference.

BACKGROUND OF THE INVENTION

1. Field of the Invention

The present invention relates generally to transferring wafers among modules of semiconductor processing equipment, and more particularly to dynamic alignment of each wafer with a support blade that carries the wafer, wherein dynamic alignment apparatus and methods determine the location of a center of the wafer with respect to a center of the blade as the blade moves the wafer through a slot from one module to another module.

2. Description of the Related Art

In the manufacture of semiconductor devices, process chambers are interfaced to permit transfer of wafers or substrates, for example, between the interfaced chambers. Such transfer is via transport modules that move the wafers, for example, through slots or ports that are provided in the adjacent walls of the interfaced chambers. Transport modules are generally used in conjunction with a variety of wafer processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of vacuum transport modules which operate as an intermediate wafer handling apparatus (typically maintained at a reduced pressure, e.g., vacuum conditions). By way of example, a vacuum transport module may be physically located between one or more clean room storage facilities where wafers are stored, and multiple wafer processing modules where the wafers are actually processed, e.g., etched or have deposition performed thereon. In this manner, when a wafer is required for processing, a robot arm located within the transport module may be employed to retrieve a selected wafer from storage and place it into one of the multiple processing modules.

As is well known to those skilled in the art, the arrangement of transport modules to "transport" wafers among multiple storage facilities and processing modules is frequently referred to as a "cluster tool architecture" system. FIG. 1 depicts a typical semiconductor process cluster architecture 100 illustrating the various chambers that interface with a vacuum transport module 106. Vacuum transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and/or sputtering.

Connected to vacuum transport module 106 is a load lock 104 that may be implemented to introduce wafers into vacuum transport module 106. Load lock 104 may be coupled to a clean room 102 where wafers are stored. In addition to being a retrieving and serving mechanism, load lock 104 also serves as a pressure-varying interface between vacuum transport module 106 and clean room 102. Therefore, vacuum transport module 106 may be kept at a constant pressure (e.g., vacuum), while clean room 102 is kept at atmospheric pressure.

Consistent with the growing demands for cleanliness and high processing precision, the amount of human interaction during and between processing steps has been reduced by the use of robots for wafer transfer. Such transfer may be from the clean room 102 to the load lock 104, or from the load lock 104 to the vacuum transport module 106, or from the vacuum transport module 106 to a processing module 108a, for example. While such robots substantially reduce the amount of human contact with each wafer, problems have been experienced in the use of robots for wafer transfer. For example, in a clean room a blade of a robot may be used to pick a wafer from a cassette and place it on fingers provided in the load lock 104. However, the center of the wafer may not be accurately positioned relative to the fingers. As a result, when the blade of the robot of the vacuum transport module 106 picks the wafer from the fingers of the load lock 104, the center of the wafer may not be properly located, or aligned, relative to the center of the blade. This improper wafer center-blade center alignment, also referred to as "wafer-blade misalignment" or simply "wafer misalignment," continues as the robot performs an "extend" operation, by which the blade (and the wafer carried by the blade) are moved through a slot in the processing module and by which the wafer is placed on pins in the processing module 108a, for example.

Even if there was proper original wafer-blade alignment when the wafer was initially placed in the exemplary processing module 108a, and even though the wafer may have thus been properly aligned during processing in the exemplary processing module 108a, the proper alignment may be interfered with. For example, electrostatic chucks generally used in the exemplary processing modules 108a may have a residual electrostatic field that is not completely discharged after completion of the processing. In this situation, the processed wafer may suddenly become detached from the chuck. As a result, the wafer may become improperly positioned with respect to the robot blade that picks the processed wafer off the chuck. Thus, when the blade of the robot of the vacuum transport module 106 picks the processed wafer off the chuck, the center of the wafer may not be properly located, or aligned, relative to the center of the blade. This wafer misalignment may continue as the robot performs a "retract" operation, by which the blade (and the wafer carried by the blade) are moved through the slot in the processing module 108a. Such wafer misalignment may also continue during a subsequent extend operation by which the wafer is placed in another one of the processing modules 108b, or in the load lock 104.

Wafer misalignment is a source of wafer processing errors, and is of course to be avoided. It is also clear that the amount of time the robots take to transfer a wafer among the modules (the "wafer transfer time") is an amount of time that is not available for performing processing on the wafer, i.e., the wafer transport time is wasted time. Thus, there is an unfilled need to both monitor the amount of such wafer misalignment, and to perform such monitoring without greatly increasing the wafer transfer time.

However, a problem complicating such monitoring of wafer misalignment is that a wafer may be transferred from (or to) the one vacuum transport module 106 to (or from) as many as six, for example, processing modules, e.g., 108a. In the past, attempts to determine whether a wafer is properly aligned on the blade of a robot have included use of many sensors between adjacent modules. Sensors on opposite sides of a wafer transfer path have been located symmetrically with respect to the wafer transfer path. The symmetrically opposed sensors produce simultaneous output signals, and one data processor has to be provided for each such sensor. The combination of these factors (i.e., the possible use of six processing modules plus the vacuum transport module, the use of many symmetrically located opposing sensors per module, and the use of one data processor per sensor) result in increased complexity and the need for many costly processors for a cluster tool architecture. In view of the need to provide cluster tool architectures that are more cost-efficient, the incorporation of separate data processors for each sensor can make a system prohibitively expensive.

Another aspect of providing cluster tool architectures that are more cost-efficient relates to the cost of machining the modules and the load locks to provide apertures in which sensors, such as through-beam sensors, may be received. As the accuracy of such machining is increased to more accurately locate the sensors with respect to the robots, for example, there are increased costs of such precision machining. What is needed is a way of requiring less accuracy in machining the apertures for the sensors without sacrificing the accuracy of detections made using the sensors.

The use of such through-beam sensors also presents problems in the design of apparatus for monitoring wafer misalignment. For example, when a wafer moves through a light beam of such a through-beam sensor and breaks the beam, it takes a period of time (latency period) for the sensor to output a pulse indicative of the breaking of the beam. Since the wafer is moving relative to the sensor, and when the purpose of the sensor is to determine the location of the wafer, by the time the output pulse is generated (at the end of the latency period) the wafer will have moved from the location of the wafer when the beam was broken. The latency period is a source of errors in the use of the through-beam sensors. What is also needed then is a way of reducing the errors caused by the latency period of through-beam sensors.

In view of the foregoing, there is a need for methods and apparatus for wafer alignment that operate while the wafer is being transported without increasing the wafer transport time (e.g., without reducing the rate of transfer of the wafer among the modules or load locks). Such method and apparatus should not only reduce the number of data processors per sensor, but reduce the total number of data processors used for determination of wafer misalignment in an entire cluster tool architecture. Such method and apparatus desirably also require less accuracy in machining the apertures for the sensors, without sacrificing the accuracy of detections made using the sensors. Another aspect of the desired method and apparatus is to eliminate the latency period as a source of errors in using through-beam sensors to make wafer alignment determinations.

SUMMARY OF THE INVENTION

Broadly speaking, the present invention fills these needs by providing dynamic alignment of each wafer with a support blade that carries the wafer, wherein dynamic alignment apparatus and methods determine the location of a center of the wafer with respect to a center of the blade as the blade moves the wafer through a module port or slot from one module to another module. By determining the offset of the wafer relative to the blade, the robot can use this determined offset to enable precision alignment and placement in process chambers of the cluster tool architecture.

One aspect of the present invention is a method and apparatus for determining wafer misalignment that provides sensors operative while the wafer is being transported and without increasing the wafer transport time, that is, without reducing the rate of transfer of the wafer among the modules or load locks.

Another aspect of the present invention is the use of a calibration wafer of known physical characteristics to calibrate a blade, a robot, and newly machined apertures which receive wafer sensors. The calibration method and apparatus of the invention require less accuracy in machining the apertures for the sensors, without sacrificing the accuracy of wafer alignment determinations made using the sensors, because the calibration accurately determines the location of each sensor after the sensor has been inserted into the aperture. A calibration method uses the calibration wafer to calibrate a system for generating data indicating the position of a center of a wafer relative to a center of a blade of a wafer transport robot, wherein the wafer is provided with at least one edge.

The method starts by mounting the wafer transport robot adjacent to semiconductor manufacturing equipment having a port so that the robot moves the wafer through the port along a wafer transport axis. At least two sensors are spaced along the port on an axis that is transverse to the wafer transport axis. The sensors are tripped by the presence of the wafer edge and by the absence of the wafer following the presence of the wafer edge. Each time one of the sensors is tripped the tripped one of the sensors is effective to generate a separate data item. A calibration wafer of known dimensions is secured to the blade in a position centered with respect to the center of the blade. Data is captured as to the position of the sensors relative to the robot by causing the robot to move the calibration wafer through the port and past the sensors. The sensors generate the separate data items, each of the separate data items indicating the location of one of the edges of the calibration wafer as the calibration wafer moves past the sensors. An accurate determination is made as to the location of the sensor with respect to the robot by using the location of the robot corresponding to each separate data item, and using data as to the radius of the calibration wafer, and using the separate data items.

In another aspect of the present invention, only one data processor is needed regardless of how many sensors are provided per module and regardless of which of many modules is receiving or supplying a wafer. The method and apparatus of the present invention not only reduce the number of data processors per sensor, but reduce the total number of data processors used for determination of wafer misalignment in an entire cluster tool architecture. This advantage results in part from accounting for the latency period of through-beam sensors when positioning such sensors relative to the path of the wafer. In detail, the need for only one processor results from positioning such sensors along a transverse axis of a module slot in a non-symmetrical manner so as to assure that a first such sensor generates a transition signal and in response to the transition signal the robot position information related to that signal is stored before a second such sensor generates a next transition signal.

An apparatus having these characteristics is provided for generating data indicating the position of a center of the wafer relative to the center of a blade of a wafer transport robot as the blade moves the wafer at a controlled rate of transfer along a path that extends through a plane defined by a facet of a module of semiconductor manufacturing equipment. Initially, a sensor positioning axis extends in the plane and intersects the path. A first sensor is mounted in the plane, on the positioning axis, and spaced from the path by a first distance so as to sense the wafer moving in the path. The first sensor has a latency period between a first time of sensing the wafer and a later time at which robot position data is stored in response to a transition signal output by the first sensor to indicate the sensing of the wafer.

A second sensor is mounted in the plane, on the positioning axis, and spaced from the path by a second distance so as to sense the wafer moving in the path. The second distance is different from the first distance by an amount such that at the given rate the time between a first moment at which the wafer is sensed by the first sensor and a second moment at which the wafer is sensed by the second sensor is not less than the latency period.

An apparatus having these characteristics is also provided for generating data indicating the position of a wafer relative to a blade of a wafer transport robot as the blade continuously moves the wafer along a path that extends through a plane defined by one of a plurality of facets of a plurality of modules of semiconductor manufacturing equipment. A sensor positioning axis extends in each of the planes and intersects the respective path. A first sensor is mounted in each of the planes, on the respective positioning axis, and spaced from the respective path by a first distance so as to sense the wafer moving in the respective path. The first sensor has a first latency period between a first time at which the first sensor senses the wafer in the respective path and a later time at which robot position data is stored in response to a first transition signal output by the first sensor to indicate a first sensing of the wafer in the respective path.

A second sensor is mounted in each of the planes, on the respective positioning axis, and spaced from the respective path by a second distance so as to sense the wafer moving in the respective path. The second sensor outputs a second transition signal indicating a second sensing of the wafer in the respective path. For each second sensor with respect to each first sensor, the second distance is different from the first distance by a selected amount. That amount assures that a first moment at which the wafer moving in the respective path is sensed by the first sensor, plus the first latency period, is not later in time than a second moment at which the wafer moving in the same respective path is sensed by the second sensor. In this manner, before the second sensor senses the wafer in the respective path, the first transition signal is output by the first sensor in response to the first sensor sensing the wafer in the respective path and the robot position data is stored.

Accordingly, there is temporal spacing of the first and second transition signals output by the respective first and second sensors. An important result of the temporal spacing of the transition signals is that only one processor is needed for receiving each of the first and second transition signals. In other words, because the transition signals are not generated at the same time, there is no need for multiple processors that operate simultaneously to process the transition signals. Although the transition signals are temporally spaced, the wafer movement may continue without interruption, such that throughput of wafers through the system is not reduced.

Such apparatus is also provided for wafers having different physical characteristics, such as a 200 mm or a 300 mm wafer diameter. Of course modifications can be made to the apparatus to accommodate smaller or larger substrates. The apparatus generates data indicating the position of the center of the wafer relative to the center of a blade of a wafer transport robot as the blade continuously moves the wafer along a path that extends through a plane defined by one of a plurality of facets of a plurality of modules of semiconductor manufacturing equipment. A sensor positioning axis extends in each of the planes and intersects the respective path. The wafer may have either of a first and a second physical characteristic, such as the 200 mm diameter or the 300 mm diameter, for example. The robot may cause the blade and the wafer carried by the blade to move in an extend motion through the respective plane into the respective module, or to move in a retract motion through the respective plane from the respective module. A first sensor is mounted in each of the planes, on the respective positioning axis, and spaced from the respective path by a first distance so as to sense the wafer moving in the respective path. The first sensor has a first latency period between a first time at which the first sensor senses the wafer in the respective path and a later time at which robot position data is stored in response to a first transition signal indicating the sensing of the wafer in the respective path.

A second sensor is also provided for use with either the 200 mm diameter wafers or the 300 mm diameter wafers. For the 200 mm wafers, the second sensor is mounted in each of the planes, on the respective positioning axis, and spaced from the respective path by a second distance so as to sense the wafer moving in the respective path. The second sensor outputs a second transition signal indicating the sensing of the wafer in the respective path. For each second sensor with respect to each first sensor, the second distance is different from the first distance by a selected amount. That amount assures that a first moment at which the wafer having the first physical characteristic and moving in the respective path is sensed by the first sensor, plus the first latency period, is not later in time than a second moment at which the wafer having the first physical characteristic and moving in the same respective path is sensed by the second sensor.

In this manner, before the second sensor senses the wafer in the respective path, the first transition signal is output by the first sensor in response to the first sensor sensing the wafer having the first physical characteristic and in the respective path, and the robot position data is stored. As a result, for the wafer having the first physical characteristic there is temporal spacing of the first and second transition signals output by the respective first and second sensors.

For the 300 mm diameter wafers, the second sensor is also mounted in each of the planes and on the respective positioning axis, but is relocated so as to be spaced from the respective path-by a third distance. As relocated, the second sensor senses the wafer having the second physical characteristic and moving in the respective path. For ease of description, the relocated second sensor spaced by the third distance is referred to as the "third" sensor. The third sensor has a third latency period between a third time at which the third sensor senses the wafer in the respective path and a later time. The later time occurs once the third sensor outputs a third transition signal indicating the sensing of the wafer having the second physical characteristic and in the respective path and robot position data is stored. For each third sensor with respect to each first sensor, the third distance is different from the first distance by an amount such that a third moment at which the wafer having the second physical characteristic and moving in the respective path is sensed by the third sensor, plus the third latency period, is not later in time than a fourth moment at which the wafer having the second physical characteristic and moving in the same respective path is sensed by the first sensor.

Accordingly, before the first sensor senses the wafer having the second physical characteristic and in the respective path, the third transition signal is output by the third sensor in response to the third sensor sensing the wafer having the second physical characteristic and in the respective path. For the wafer having the second physical characteristic, the first and third transition signals are output by the respective first and third sensors in temporal spacing. In view of the provision of a plurality of facets and sensors on the plane of each facet, logic circuitry is used to combine all of the outputs represented by the transition signals from all of the facets through which the wafer may be moved.

A method aspect of the present invention also provides the benefit of requiring only one processor to process the transition signals. The method provides data indicating the position of the center of a wafer with respect to the center of a blade carrying the wafer, and includes an operation of mounting the wafer on the blade for movement with the blade along a path. There is also an operation o f providing a first sensor along a transverse axis that has a center at an intersection with the path, the first sensor being on one side of the center. A next operation provides a second sensor along the transverse axis and on the other side of the center, the second sensor and the first sensor being spaced by a selected distance.

The wafer is continuously moved along the path so that the first sensor is triggered by the wafer and generates a first transition signal and the second sensor is triggered by the wafer and generates a second transition signal. The need for only one processor results from placing each of the first and second sensors along the transverse axis according to a latency characteristic of the sensor so that the wafer moving through the port will be sensed by individual ones of the plurality of sensors at temporally-spaced times. The temporally-spaced times allow the first of the sensors to sense the wafer and generate a first transition signal, and allow the robot position data corresponding to each first transition signal to be stored, all before the second of the sensors senses the wafer and generates a second transition signal. Stated alternatively, the selected distance is selected to temporally space the moments in time at which the first and second sensors are triggered by the wafer so that the first transition signal is generated and the robot position data corresponding to each first transition signal is stored before the wafer triggers the second sensor.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 3A is a plan view of a portion of one face of the vacuum transport module of the cluster tool architecture, schematically showing part of a system for dynamic alignment according to the present invention, and showing a second sensor used with a wafer having a diameter of 200 mm.

FIG. 3F is a plan view of the cluster tool architecture system showing two of the sensors per face and fiber optic cables connected to beam receivers that generate transition signals for each break and make transition.

DETAILED DESCRIPTION OF THE PREFERRED EMBODIMENTS

An invention is described for determining wafer misalignment while the wafer is being transported. The determination is made without increasing the wafer transport time, that is, without reducing the rate of transfer of the wafer among modules or load locks. The embodiments of the invention are also described with respect to reducing the number of data processors per sensor, and reducing the total number of data processors used for determination of wafer misalignment in an entire cluster tool architecture. The invention is further described as requiring less accuracy in machining apertures for the sensors, without sacrificing the accuracy of detections made using the sensors. In conjunction with reducing the number of data processors per sensor, and reducing the total number of data processors used for determination of wafer misalignment in an entire cluster tool architecture, detailed description also shows how sensor latency periods are eliminated as sources of errors when throughbeam sensors are used to make wafer alignment determinations.

It will be obvious, however, to one skilled in the art, that the present invention may be practiced without some or all of these specific details. In other instances, well known process operations have not been described in detail in order not to obscure the present invention.

Figure 1:
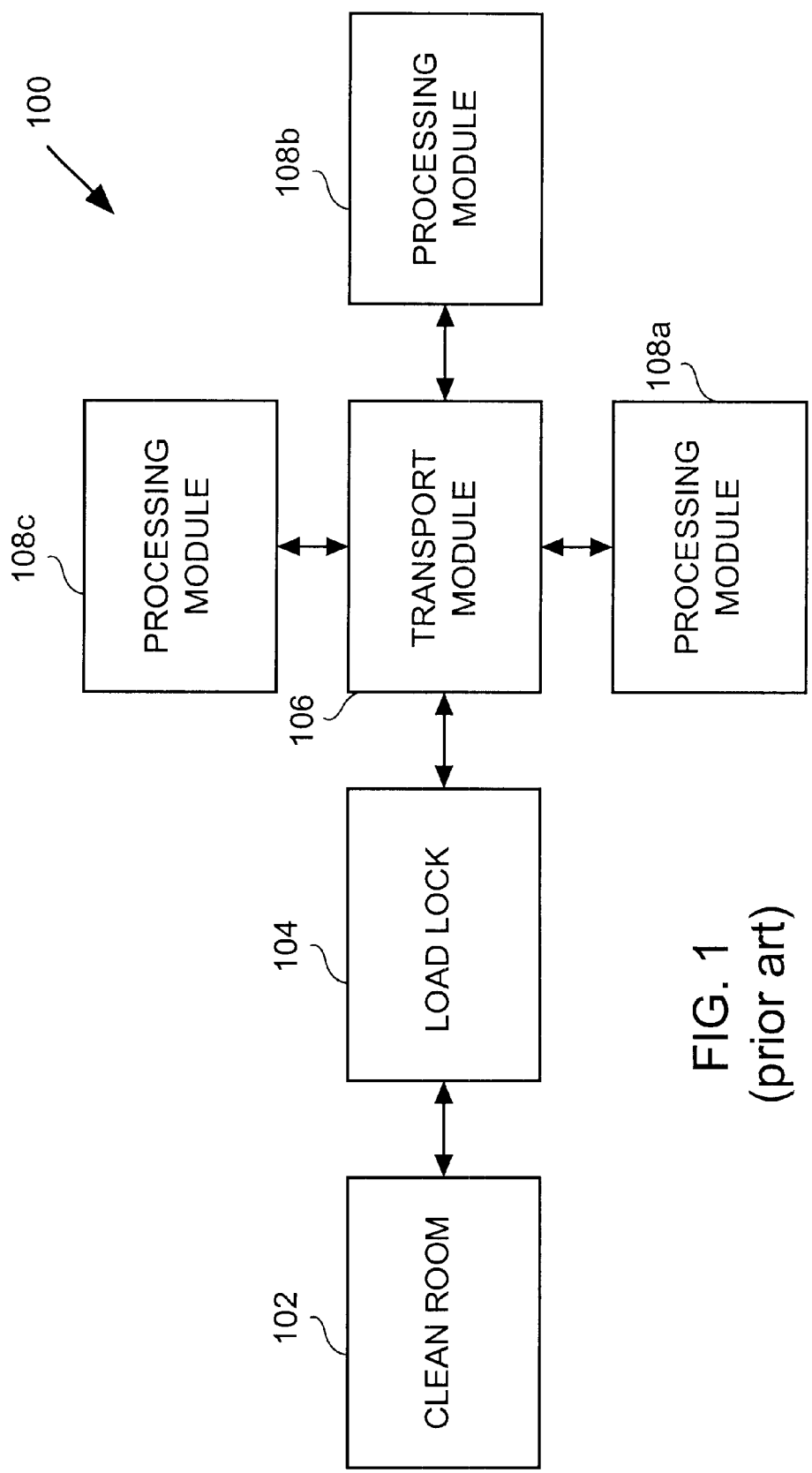
FIG. 1 depicts a typical prior art semiconductor process cluster tool architecture illustrating an atmospheric transfer module that interfaces with a vacuum transport module, wherein a load lock receives wafers for transfer to the vacuum transport module.
Figure 2A:
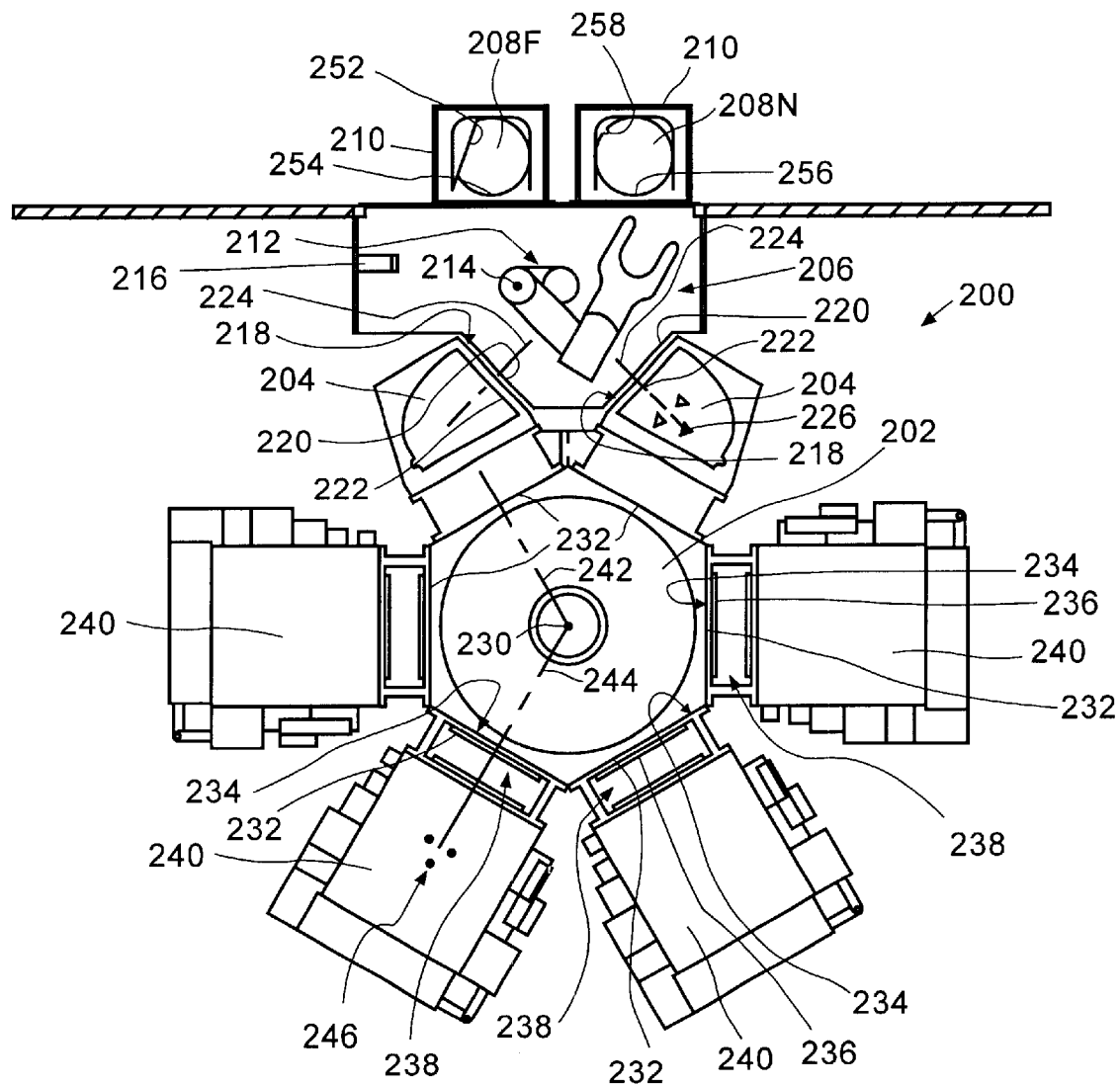
FIG. 2A is a plan view of a semiconductor process cluster tool architecture according to the present invention, illustrating a vacuum transport module robot mounted for rotation on a fixed axis and carrying a blade that transports a wafer into a vacuum processing module.

Referring to FIG. 2A, the invention is generally described as including a semiconductor process cluster tool architecture system 200 having a vacuum transport module 202, at least one load lock 204 (or wafer transport enclosure), and an atmospheric transport module 206 for transferring substrates, or wafers, 208 from one or more cassettes 210 to the load locks 204. Preferably, two adjacent load locks 204 are provided, one at each of two adjacent sides of the vacuum transport module 202. Also, the atmospheric transfer module 206 includes at least two cassettes 210, a front end robot 212 mounted on a fixed axis of rotation 214, and a wafer aligner 216. The aligner 216 is used to find the desired position of the wafer before it is moved into the cluster architecture 200. Each of the load locks 204 has a wafer receiving face 218 provided with a load lock port 220 through which the wafers 208 may be transferred. Each port 220 may be closed by a gate valve, or door, 222. The front end robot 212 transfers the wafers 208 through the ports 220 along a load lock wafer transfer axis 224 that is centrally positioned relative to the port 220 and is perpendicular to the face 218. The front end robot 212 places the wafers 208 on fingers 226 in the load lock 204.

Figure 2B:
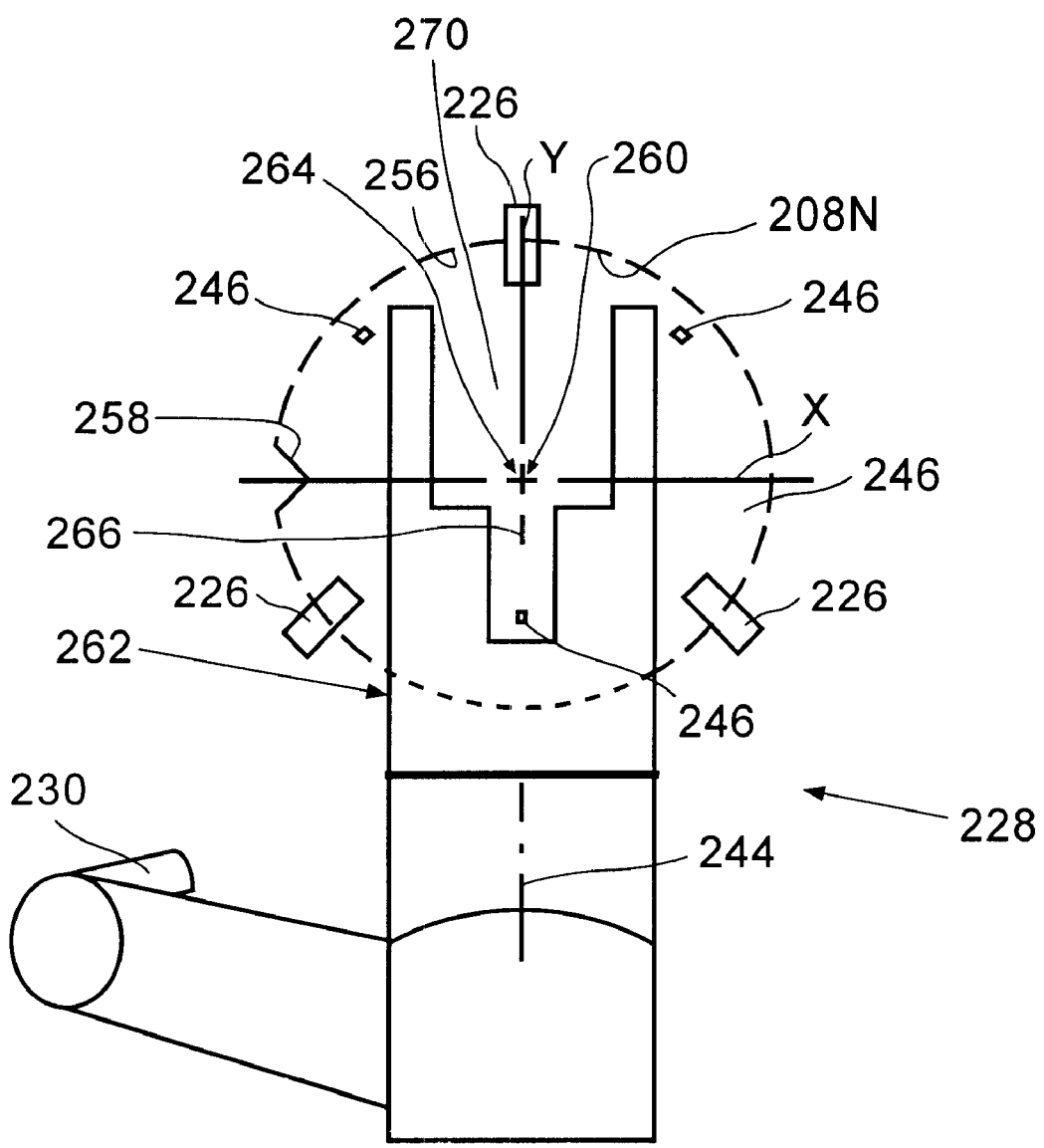
FIG. 2B illustrates a plan view of the blade carrying a wafer properly aligned with the blade.
Figure 2C:
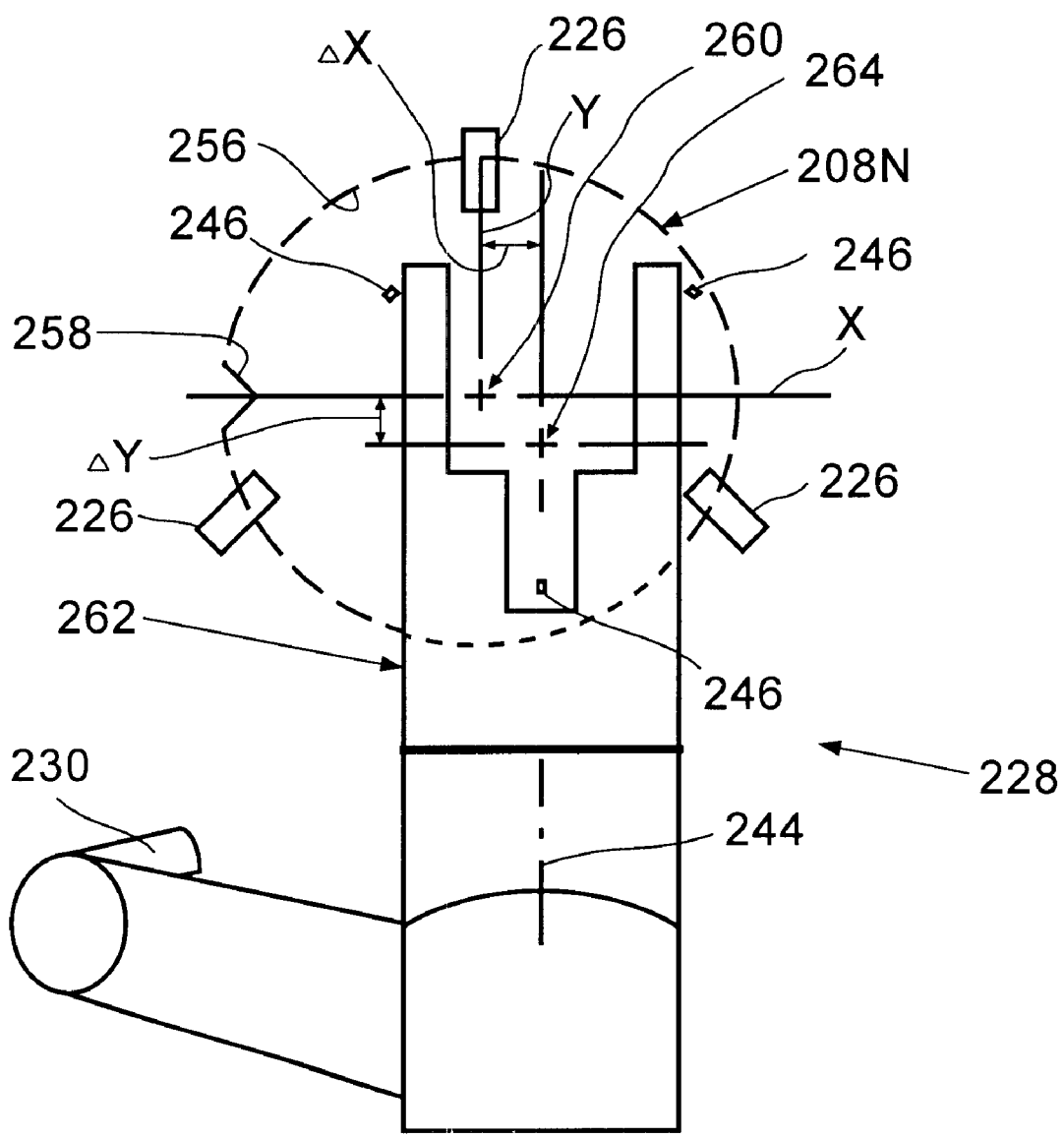
FIG. 2C illustrates a plan view of the blade carrying a wafer improperly aligned with the blade, showing the wafer misalignment that may be determined according to the present invention.

From the load locks 204, the wafers 208 are transferred to the vacuum transport module 202. Referring also to FIGS. 2B and 2C, the module 202 includes a vacuum transfer robot 228 that is installed at a central axis 230. The module 202 has six wafer transfer faces 232, each of which is provided with a port 234 that may be closed by a gate valve, or door, 236 of a dual slot valve 238, for example. Two of the faces 232 are between the load locks 204 and the module 202, whereas an exemplary four of the faces 232 are provided with respect to four respective processing modules or chambers 240.

Considering movement of a wafer 208 from one load lock 204 into one of the processing modules 240, the vacuum transfer robot 228 picks the wafer 208 from the fingers 226 in the load lock 204. In a retract operation the robot 228 moves the picked wafer 208 through the port 234 along an incoming wafer transfer path 242 that is centrally positioned relative to the respective port 234 and is perpendicular to the respective face 232. The vacuum transfer robot 228 moves the wafer 208 into the vacuum transport module 202 on the path 242 and then along a second wafer transfer path 244 that is centrally positioned relative to the respective port 234 and respective face 232 of the processing module 240 that has been identified for processing of the wafer 208. In an extend operation, the robot 228 continues to move the wafer 208 along the second path 244 into and through the port 234 of the identified processing module 240. The robot 228 places the wafer 208 on pins 246 in the identified processing module 240. Upon completion of operations in the processing module 240, the robot 228 picks the wafer 208 from the pins 246. In a retract operation the robot 228 moves the wafer 208 along the second path 244 into and through the port 234 and back into the vacuum transport module 202.

As examples of the types of wafers 208 that may be transported, FIG. 2A shows the cassettes 210 supporting a first wafer 208F that has a flat edge 252 and a curved edge 254 (in the left cassette 210) and a second wafer 208N that has a curved edge 256 provided with a notch 258 (in the right cassette 210). The front end robot 212 picks the appropriate wafer 208F or 208N from one of the cassettes 210 and places the wafer 208 in the wafer aligner 216. The wafer aligner 216 positions the wafer 208 in a selected orientation, as described below. The front end robot 212 then picks the oriented wafer 208 from the aligner 216, transfers the oriented wafer 208F or 208N through the load lock port 220 into the load lock 204, and places the oriented wafer 208 on the fingers 226.

Because of the orienting operation of the aligner 216, as placed on the fingers 226 the oriented wafer 208 has either the flat edge 252 or the notch 258 in one of many desired orientations with respect to a wafer center 260 and X and Y wafer axes that intersect at the wafer center 260. One of those orientations of the wafer 208N is shown in FIG. 2B with the wafer 208N (shown in dashed lines) supported by a blade 262 of the vacuum transport robot 228. The Y wafer axis may be thought of as extending through noon and six o'clock positions of the face of a clock, for example, wherein the wafer center 260 is at the center of the face. With this in mind, the exemplary desired orientation depicts the wafer 208N having been rotated on the wafer center 260 so that the notch 258 is at a nine o'clock position. It may be understood that the desired orientations of each of the wafer 208N and the wafer 208F include having the respective notch 258 at, or flat edge 252 facing, any of the noon, three-o'clock, six o'clock or nine o'clock positions, for example, relative to the wafer center 260.

Different ones of the wafers 208 may also have different physical characteristics other than the flat edge 252 or the notch 258. For example, the cluster tool architecture system 200 is adapted to process wafers 208 having different diameters. Although many different diameter wafers may be processed, the present invention is described with respect to wafers 208 having 200 mm and 300 mm diameters, for example.

For a particular manufacturing situation, there is a particular orientation of the flat edge 252 or of the notch 258 with respect to the wafer center 260. In addition to such orientation, there is an ideal location of the center 260 of the oriented wafer 208 with respect to a blade center 264 of the blade 262. Such ideal location is depicted in FIG. 2B in which the wafer center 260 and the blade center 264 are at the same location, with the Y axis of the wafer 208 co-extensive with a longitudinal axis 266 of the blade 262. The wafer 208 in the ideal location is shown as a disk defined by a dashed circular line in FIG. 2B. However, for reasons including those described above (e.g., electrostatic chuck performance and handling), the wafer 208 is sometimes located on the blade 262 with the wafer center 260 out of alignment with the blade center 264. This out of alignment situation is illustrated in FIG. 2C by the wafer 208N shown by a dashed line. This out of alignment situation corresponds to the "wafer-blade misalignment" and "wafer misalignment" described above. Wafer misalignment is characterized by the wafer center 260 being spaced from the blade center 264. Such spacing may be in one or both of the directions of the X axis or the Y axis of the wafer 208, wherein spacings in both such direction are shown in FIG.

2C, such that the wafer center 260 is to the left by an amount delta X and up by an amount delta Y from that shown in FIG. 2B.

It may be understood that because the blade 262 carries the wafer 208 to the pins 246 in the processing chamber 240, the location of the center 260 of the wafer 208 need only be determined with respect to the blade center 264 and not with respect to any other equipment of the cluster tool architecture system 200. For example, when a particular wafer 208 is being transported, once a determination is made as to the amount and direction of the wafer misalignment, the robot 228 may control the location of the blade 262, and thus control the position of the particular wafer 208, so as to eliminate the wafer misalignment when the blade 262 places the particular wafer 208 on the pins 246 in the processing module 240. With the wafer misalignment eliminated, accurate processing of the wafer may proceed in the processing module 240.

The blade 262 of the vacuum transport robot 228 is shown in FIG. 2B as being in the vacuum processing module 240. For illustrative purposes, the fingers 226 of the load locks 204 are shown as rectangles superimposed on the depiction of the blade 262. The blade 262 is shaped to avoid contact with the load lock fingers 226 during the picking operation in the load lock 204, and to avoid contact with the wafer support pins 246 of the processing module 240. This shape provides an open space 270 between the pins 246 so that the blade 262 will not interfere with the operations described below for determining whether there is wafer misalignment.

Figure 3B:
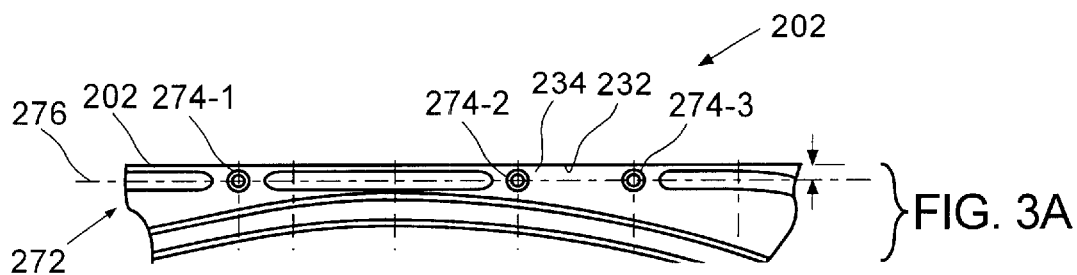
FIG. 3B is a plan view of the wafer having a 200 mm diameter, illustrating times at which the wafer breaks and makes beams of the sensors shown in FIG. 3A.
Figure 3B:
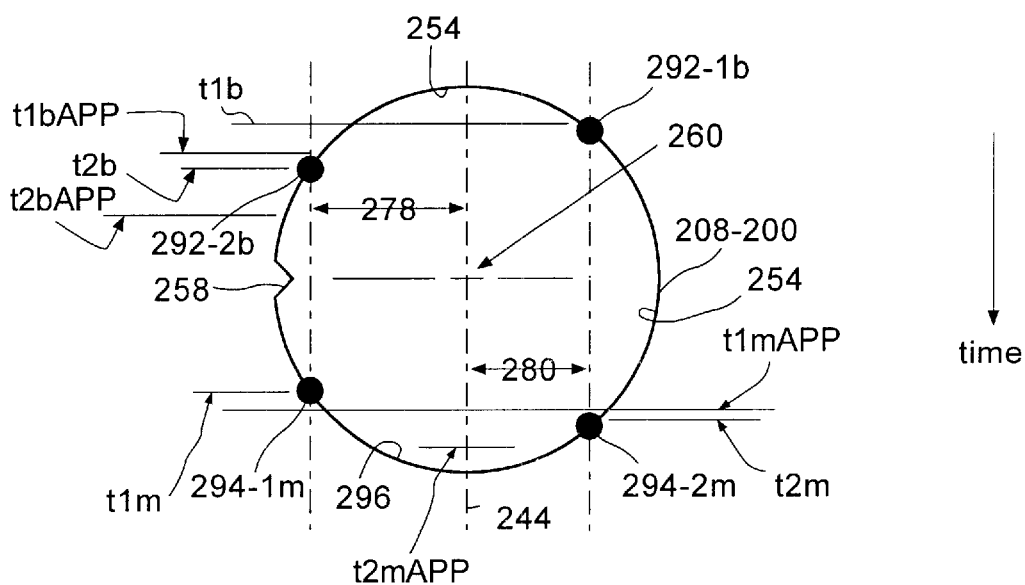
Figure 3C:
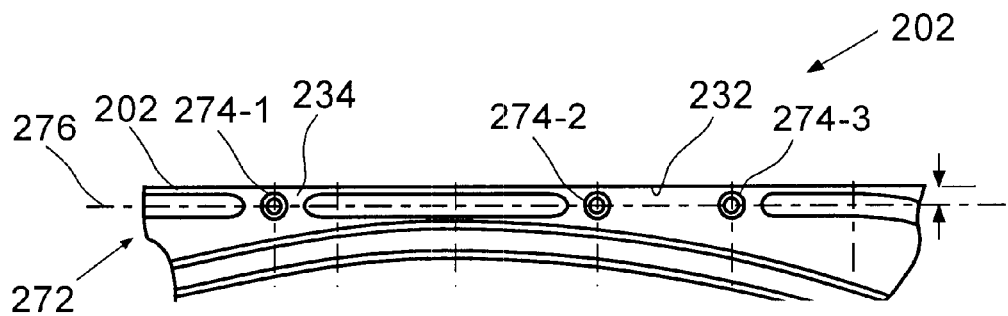
FIG. 3C is a plan view of the same portion of the face of the vacuum transport module of the cluster tool architecture, schematically showing part of the system for dynamic alignment according to the present invention, and showing a third sensor used with a wafer having a 300 mm diameter.

FIGS. 3A and 3C are partial plan views of a face 232 of the vacuum transport module 202, schematically showing part of a system 272 for dynamic alignment according to the present invention. The term "dynamic alignment" is used herein to denote the present apparatus and methods which determine the location of the center 260 of the wafer 208 with respect to the center 264 of the blade 262 as the blade 262 moves the wafer 208 through one of the ports 234 from the vacuum transport module 202 to one of the processing module 240, or through one of the ports 234 from the processing modules 240 into the vacuum transport module 202, for example. For each face 232 and type of wafer 208 having a particular diameter as a selected physical characteristic, the system 272 includes two sensors 274. For a system 272 for wafers 208 having the 200 mm and 300 mm diameters, each face 232 has one sensor 274, identified in FIGS. 3A and 3C as sensor 274-1, and one of two further sensors 274, identified as sensors 274-2 and 274-3.

Figure 3D:
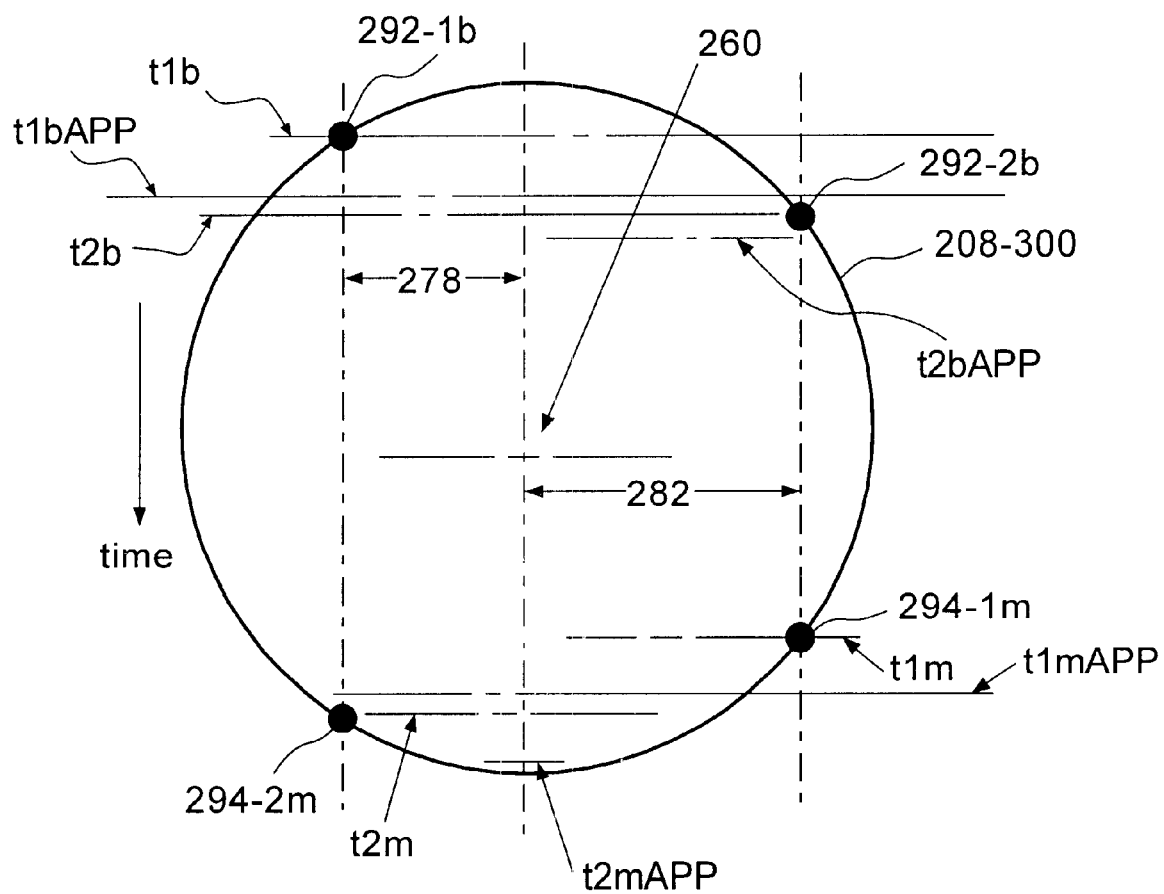
FIG. 3D is a plan view of the wafer having the 300 mm diameter, illustrating times at which the wafer breaks and makes beams of the sensors shown in FIG. 3C.
Figure 3E:
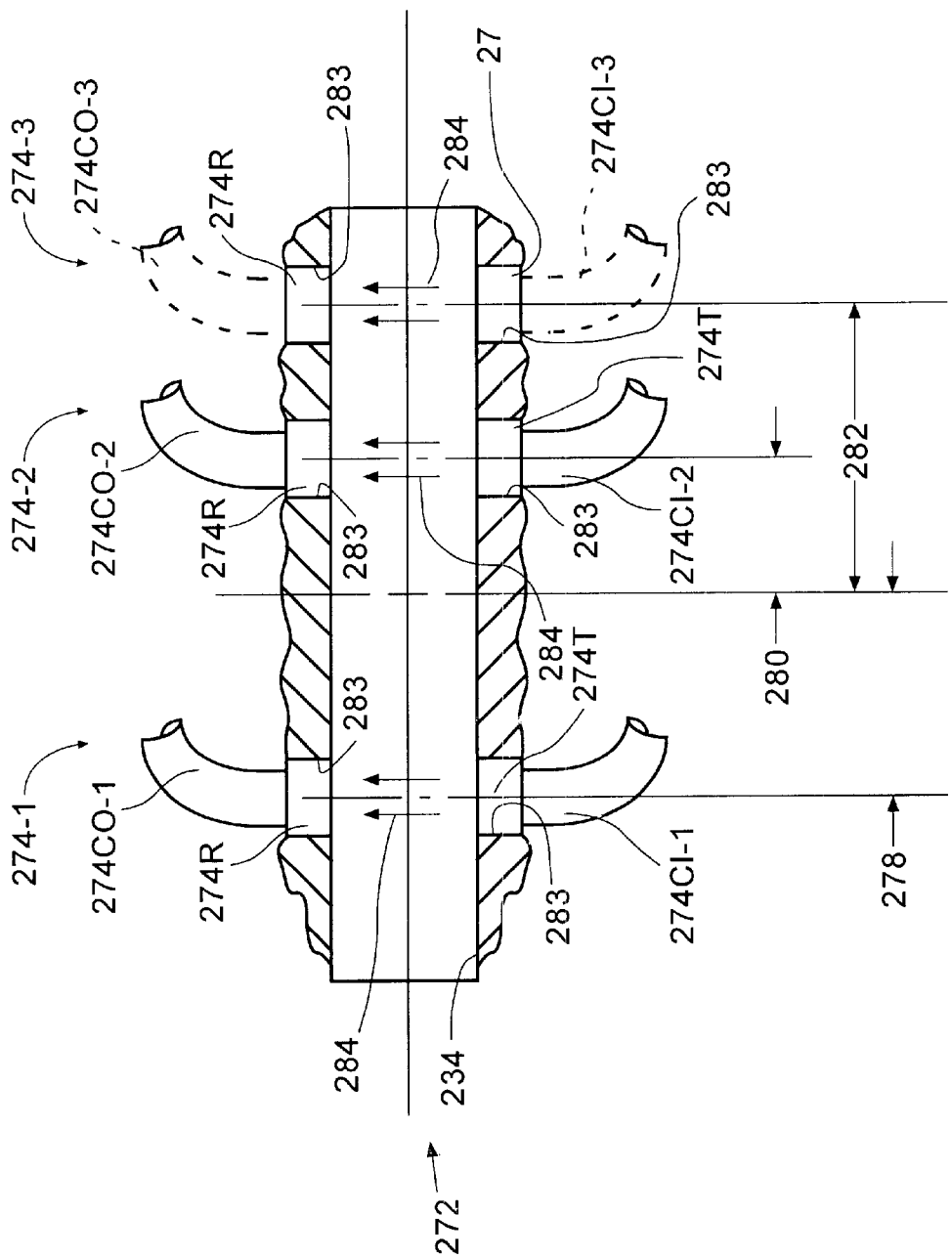
FIG. 3E is an elevational view of a port of one of the faces, showing three sensors which include fiber optic cables for supplying light beams which the wafers break and make.

For ease of description, FIG. 3F shows only two of the sensors 274 (i.e., the two for a 200 mm diameter wafer 208-200), whereas each of FIGS. 3A, 3C, and 3E shows the three sensors 274-1, 274-2, and 274-3. A first of the sensors 274-1 is mounted in a plane parallel to that defined by the face 232 and on a sensor positioning axis 276 that may be the transverse axis of the port 234 adjacent to that face 232.

FIG. 3B is a plan view of a wafer 208-200 moving through the port 234, showing successive times t1b, t2b, t1m, and t2m at which edges 254 or 296 of the wafer 208 trigger the respective sensors 274-1 or 274-2. FIG. 3B is aligned with FIG. 3A to show that the first sensor 274-1 is spaced from the wafer transport path 244 by a first distance 278. For use with the wafer 208-200, the second sensor 274-2 is also mounted in the plane parallel to that defined by the face 232 and on the sensor positioning axis 276. The second sensor 274-2 is spaced from the wafer transport path 244 by a second distance 280. For use with the 300 mm diameter wafer 208-300, the third sensor 274-3 is mounted in the plane parallel to that defined by the face 232 and on the sensor positioning axis 276. The third sensor 274-3 is spaced from the wafer transport path 244 by a third distance 282.

With such spacings, each of the sensors 274 is in position to sense the respective wafer 208 moving in the path 244 in either the extend operation or the retract operation. The sensing of the wafers 208 by the sensors 274 is shown in FIG. 3E, which is an elevational view of one of the faces 232 showing the port 234 and the sensors 274 spaced along the sensor positioning axis 276. Each sensor 274 is preferably a multi-component, through-beam sensor designed to minimize the number of the most expensive components in each sensor 274. For each sensor 274, the components that determine the location of the sensor 274 include a beam transmitter section 274T below the port 234 and a beam receiver section 274R above the port. Each of the beam transmitter sections 274T is mounted in an aperture 283 machined in the portion of the face 232 around the ports 234. As discussed below, the accuracy of locating the apertures 283 may be relatively low, such as within (±0.050 inches) without reducing the accuracy of the detections of the location of the center 260 of the wafers 208 with respect to the center 264 of the blade 262. The beam transmitter sections 274T receive a light beam 284 from an incoming fiber optic cable 274CI and by use of a lens upwardly direct the light beam 284 across the port 234. FIG. 3E shows one of the beam receiver sections 274R, which includes a lens and an output fiber optic cable 274CO mounted in a corresponding machined aperture 283 above the port 234.

With this background, it may be understood that for ease of illustration in FIG. 3F, the dashed lines identified as "274CO" represent both the input fiber optic cable 274CI and the output fiber optic cable 274CO. It may also be understood that if the location of any of the apertures 283 is not accurately known, then the location of the respective beam transmitter section 274T or the location of the respective beam receiver section 274R received in such aperture 283 will not be accurately known. As a result, the location of the sensor 274 will not be accurately known.

Figure 3G:
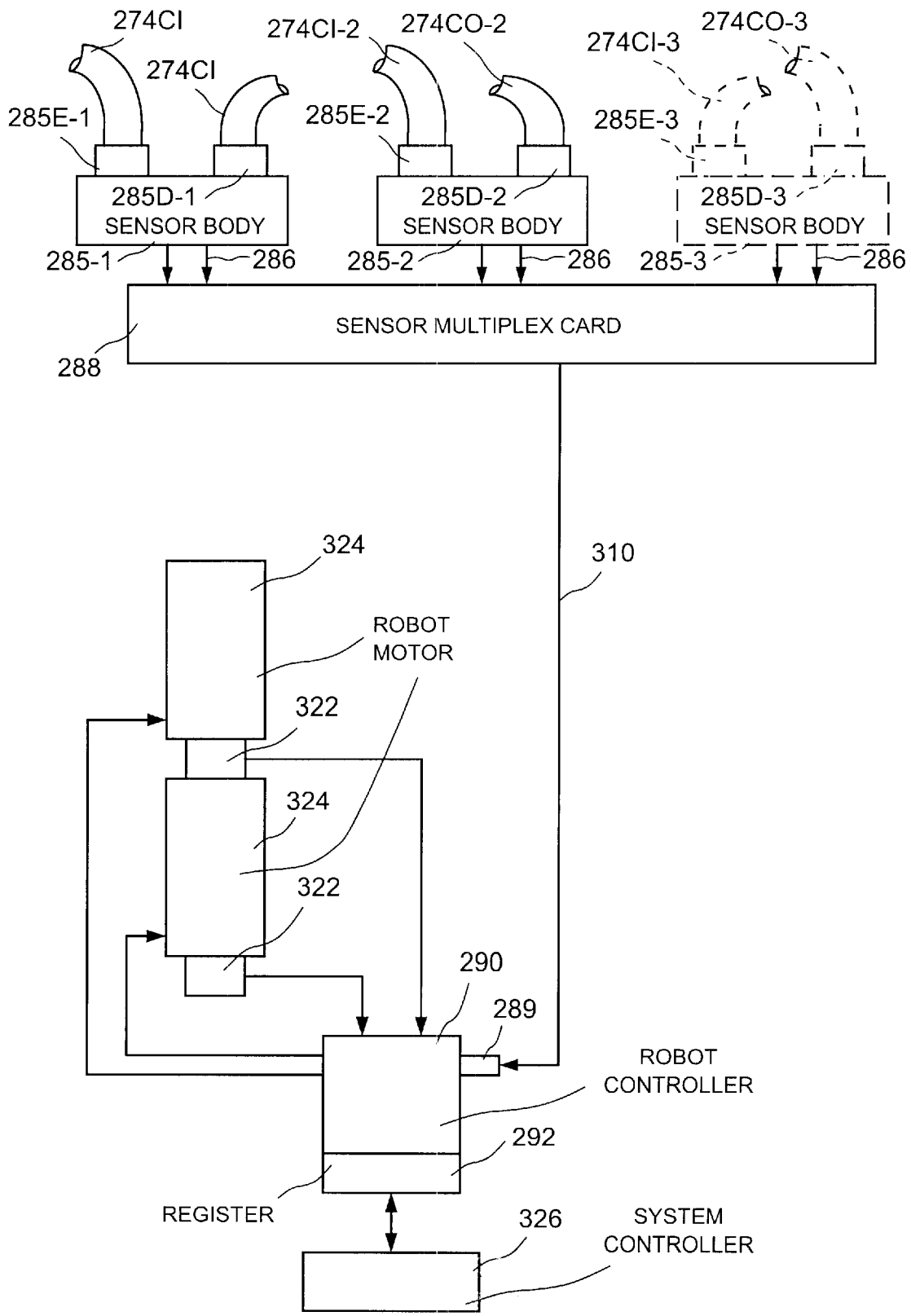
FIG. 3G is a schematic diagram illustrating a card receiving the transition signals and supplying such signals to a robot controller.

FIG. 3G shows that each sensor 274 also includes components in addition to the above sensor location components. One such component is a sensor body 285 having an emitter 285E for supplying the light beam 284 to the respective input fiber optic cable 274CI. The sensor body 285 also includes a light detector 285D that receives the beam 284 from the respective output fiber optic cable 274CO. The detector 285D converts the incoming light beam 284 from the cable 274CO into an analog signal proportional to the intensity of the incoming light beam 284. The analog signal is converted into a digital signal each time the value of the analog signal reaches a threshold level. The digital signal is an output of the sensor body 285 of the sensor 274 and is referred to as a transition signal 286.Before a wafer 208 moves into the port 234, the beam 284 is received by the receiver section 274R, is transmitted to the detector 285D and a steady state condition occurs. FIGS. 3E and 3F schematically show that when the wafer 208 is moved by the blade 262 between the transmitter section 274T and the output fiber optic cable 274CO of the receiver section 274R, the beam 284 of a sensor 274 is broken. At that time, a transition occurs, and the sensor body 285 of the sensor 274 generates the transition signal 286, which in this example is designated 286B to indicate the breaking. In an opposite sense, once the wafer 208 has been moved by the blade 262 between the transmitter section 274T and the receiver section 274R and has broken the beam 284, another steady state condition exists until the blade 262 moves the wafer 208 completely through the port 234 so that the beam 284 is no longer broken. At this juncture, the beam 284 is said to be made, another transition occurs, and that sensor body 285 of the sensor 274 generates another transition signal, indicated in FIG. 3F as 286M to indicate the making. FIGS. 3F and 3G show that the transition signals 286B and 286M are transmitted from the sensor body 285 to a sensor multiplex card 288. The card 288 is connected to an input port 289 of a robot controller 290.

Because the wafers 208 are moving when sensed by the sensors 274, and because the wafers 208 continue to move after being sensed, short response time sensors 274 are preferred. As an example, Banner brand sensors having Model number D12SP6FPY may be used and have a 50 microsecond response time. Also, because there normally are different lengths of fiber optic cable 274CI and 274CO used with the transmitter sections 274T and the receiver sections 274R, each sensor 274 has a different optical distance. Further, there are manufacturing tolerances in the sensors 274. Appropriate sensor gain adjustments are made to compensate for such path lengths and tolerances.

The cost of the system 272 may be reduced by only providing two of the sensor bodies 285 even though there are three sensors 274. In more detail, when the 200 mm diameter wafer 208-200 is to be processed, for the first sensor 274-1 one end of each of the cables 274CI and 274CO may be optically mounted in a respective one of the apertures 283 corresponding to the first sensor 274-1. FIG. 3G shows that the other end of such cables 274CO and 274CI may be optically mounted to the respective emitter 285E-1 and detector 285D-1 of the sensor body 285 (see sensor body 285-1) that corresponds to the first sensor 274-1.

For the second sensor 274-2, one end of each of the cables 274CI and 274CO may be optically mounted in a respective one of the apertures 283 corresponding to the second sensor 274-2. The other end of such cables 274CO and 274CI may be optically mounted to the respective emitter 285E-2 and detector 285D-2 of the sensor body 285 (see sensor body 285-2) that corresponds to the second sensor 274-2. Such cables are identified as 274CI-2 and 274CO-2 to indicate use with the second sensor 274-2.

FIG. 3E shows that when the 300 mm diameter wafer 208-300 is to be processed, the ends of the cables 274CI-2 and 274CO-2 that were used with the apertures 283 of the second sensor 274-2 are moved, or relocated, and are optically mounted in a respective one of the apertures 283 corresponding to the third sensor 274-3 (see cables 274CI-3 and 274CO-3 shown in dashed lines in FIG. 3E). FIG. 3G shows that the other ends of the cables 274CI-2 and 274CO-2 remain optically mounted to the respective emitter 285E-2 and detector 285D-2 of the sensor body 285-2. However, to make it clear that such sensor body 285-2 with the relocated cables 274CI-2 and 274CO-2 functions as a third sensor body, such third sensor body is identified as 285-3 and shown in dashed lines in FIG. 3G. Also, the relocated cables 274CI-2 and 274CO-2 are shown in dashed lines and identified as 274CI-3 and 274CO-3. Also, the emitter 285E2 connected to the cable 274CI-3 is shown in dashed lines and identified as 285E-3 and the detector 285D-2 connected to the cable 274CO-3 is shown in dashed lines and identified as 285D-3.

As a result of having one sensor body 285 provide these two functions, the number of the substantially higher-cost components (the sensor body 285) is reduced by one for each of the faces 232, such that in a six face architecture system 200 six sensors 274 are rendered unnecessary.

Figure 4A:
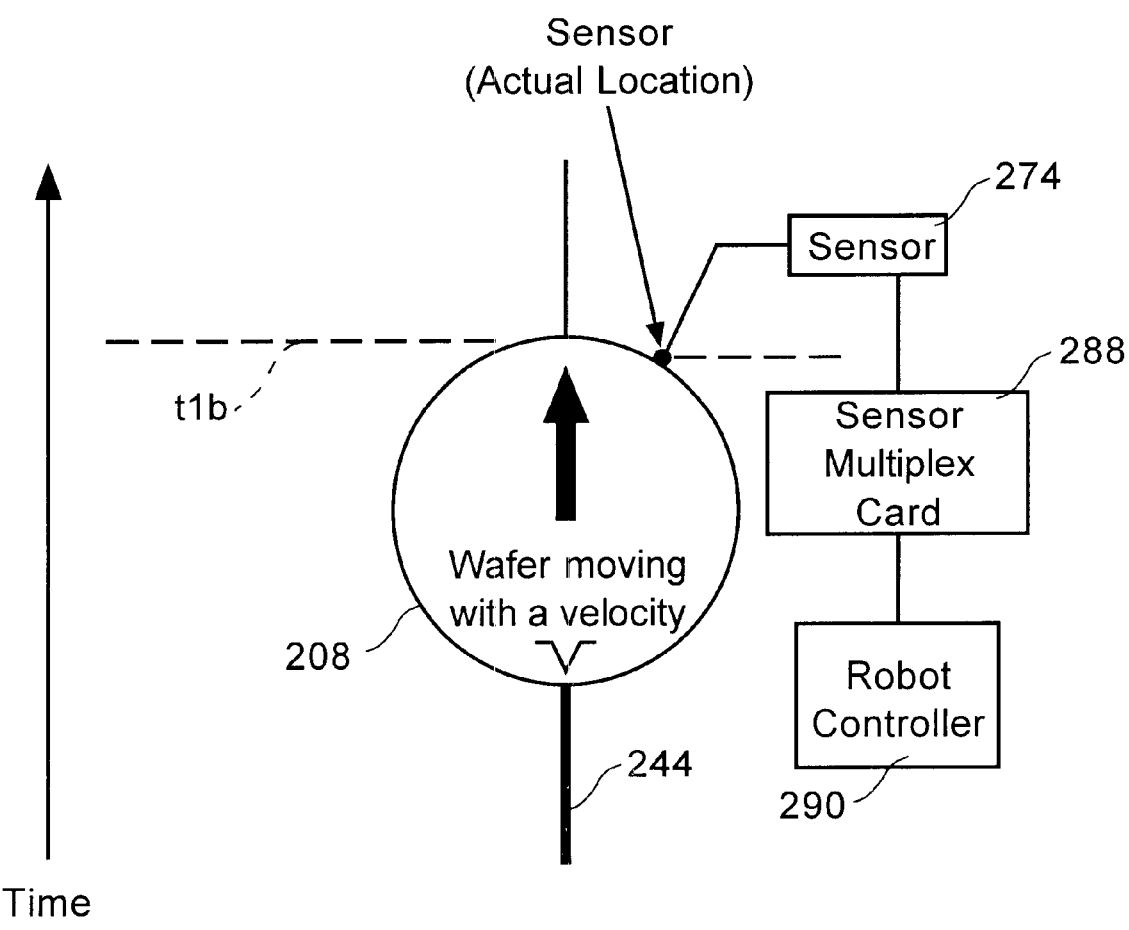
FIGS. 4A and 4B are schematic diagrams showing latency of the sensors and how apparent locations of the sensors are determined to eliminate errors due to such latency.
Figure 4B:
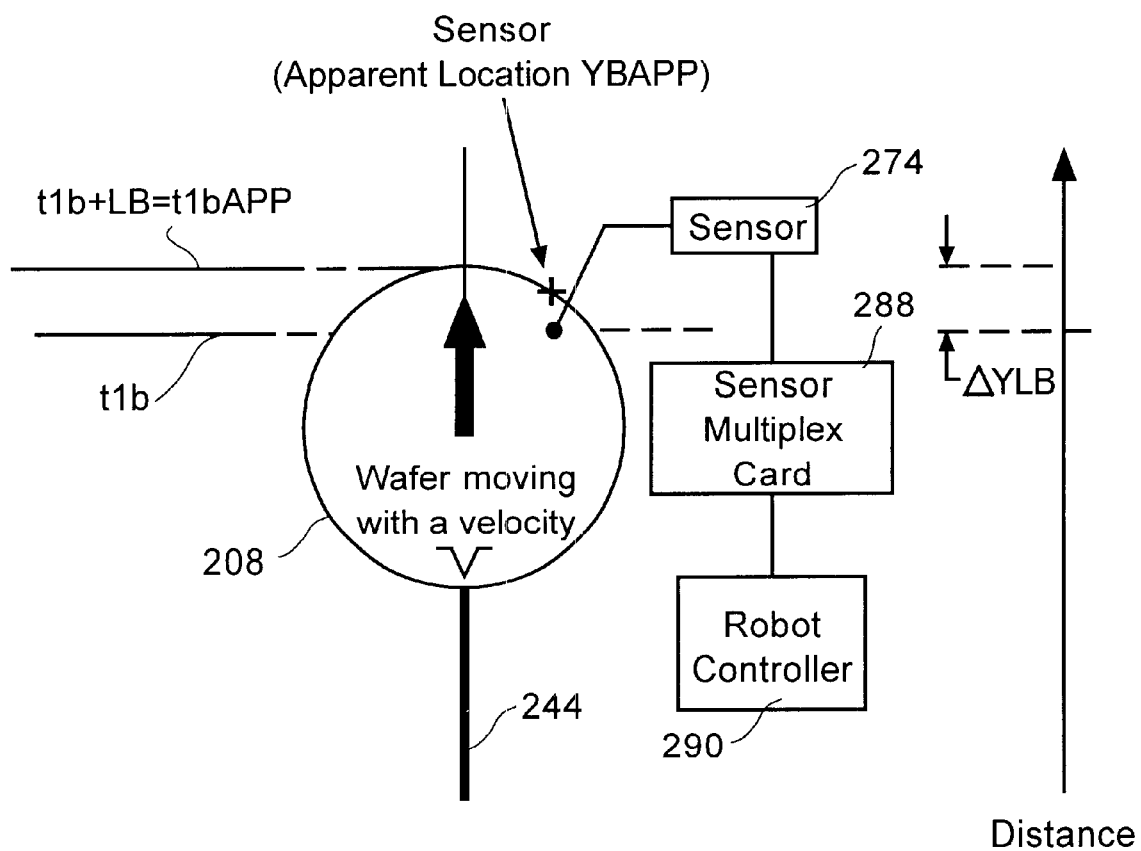

FIGS. 4A and 4B illustrate an effect of each of the sensors 274 having its own unique latency period L, one (LB) for the breaking transition, and one (LM) for the making transition. FIG. 4A depicts an extend movement of the wafer 208.

Such latency period LB is a period of time that starts at a first time t1b at which the beam 284 is broken as the sensor 274 senses the wafer 208 moving in the path 244 through the port 234. Referring to FIG. 4B, the period of time LB ends a later time t1bAPP. By time t1bAPP the transition signal 286B has arrived at the input port 289 of the robot controller 290, and in response to the transition signal 286B the robot controller 290 has stored the data described below as representing the position of the robot 228 in a register 292. The transition signal 286B indicates that the sensor 274 sensed the wafer 208 breaking the beam 284. The "APP" is used in "t1bAPP" to indicate the time of an apparent location of the sensor 274.

In terms of movement of the wafer 208 along the path 244, FIGS. 3B, 3D, 4A and 4B show that the latency period LB, for example, is a finite amount of time delay that exists between the time t1b at which the sensor 274 is "tripped" (in response to the beam 284 being broken) and the time t1bAPP at which such data representing the position of the robot 228 is stored. Since the wafer 208 was moving during the interval of the time delay from time t1b to t1bAPP, at that later time t1bAPP the leading wafer edge 254 or 256 that broke the beam 284 of the sensor 274 will no longer be exactly over the sensor 274. Because the time delay is repeatable and the velocity of the robot blade 262 (and of the wafer 208) are relatively constant over this time delay, the error from this delay may be eliminated. FIG. 4B shows that such elimination is by using, as the location of the sensors 274 for purposes of determination of wafer misalignment in the breaking transition, an apparent location XYBAPP of the sensors 274.

It may be understood that the latency period LM is also a finite amount of time delay that exists between the time t1m at which the sensor 274 is "tripped" (in response to the beam 284 being made) and the time t1mAPP at which such data representing the position of the robot 228 is stored. Since the wafer 208 was moving during the interval of the time delay from time t1m to t1mAPP, at that later time t1mAPP the trailing edge 296 that made the beam 284 of the sensor 274 will no longer be exactly over the sensor 274. Because the time delay is repeatable and the velocity of the robot blade 262 (and of the wafer 208) are relatively constant over this time delay, the error from this delay may also be eliminated. Such elimination is by using, as the location of the sensors 274 for purposes of determination of wafer misalignment in the making transition, an apparent location XYMAPP of the sensors 274.

The apparent location XYBAPP is the position in the Cartesian coordinate system that the sensor 274 would have if the sensor 274 were infinitely fast and if the data representing the robot position was stored in the register 292 at the same time as in the real system (i.e., at time t1bAPP). The apparent location XYMAPP is not shown in FIG. 4B, and is a position in the Cartesian coordinate system that the sensor 274 would have if the sensor 274 were infinitely fast and if the transition signals 286 arrived at the robot controller 290 at the same time as in the real system (i.e., at time t1mAPP).

The calibration process described below is used for determining each of the apparent locations XYBAPP and XYMAPP of the sensors 274, for each of extend and retract operations.

In accordance with the present invention, the respective latency periods LB and LM for each sensor 274 in each of the respective breaking and making transitions are taken into consideration in the selection of the respective values for the distances 278, 280, and 282 for the spacing of the respective sensors 274-1, 274-2, and 274-3 along the axis 276. This is illustrated in the plan views of FIGS. 3B and 3D which respectively show the 200 mm diameter wafer 208-200 and the 300 mm diameter wafer 208-300 moving horizontally (upwardly in FIGS. 3B and 3D, such that increasing time is measured downwardly). Also, the break and make transition events are shown by dots 292. For example, dot 292-2b corresponds to the time t2b at which the first beam 284-1 of the first sensor 274-1 is broken by the edge 254 of the wafer 208-200. The time t1bAPP, representing the end of the latency period LB and the time at which the data representing the robot position is stored in the register 292, is shown occurring before the time t2b of the second break transition represented by dot 292-2b. FIG. 3B shows that the beam 284-2 of the second sensor 274-2 was broken first by the edge 254 of the 200 mm diameter wafer 208-200. When the distances 278 and 280 are non-symmetrical with respect to the path 244, the data representing the robot position is stored in the register 292 before the second breaking of the beam (represented by dot 292-2b) which occurs at time t2b.

As an example of the making transition, dot 294-1m corresponds to the time t1m at which the first beam 284-1 of the first sensor 274-1 is first made after a trailing portion 296 of the edge 254 of the wafer 208-200 moves past the first sensor 274-1. The time t1mAPP, representing the end of the latency period LM and the time at which data representing the robot position is stored in the register 292, is shown occurring before the time t2m of the make transition represented by dot 294-2m. In this manner, because the distances 278 and 280 are non-symmetrical with respect to the path 244 the data representing the robot position will be stored before the time t2m of the second making of the beam (represented by dot 294-2m).

FIG. 3D shows a similar situation for the 300 mm diameter wafer 208-300, with the exception that the beam 284-1 of the first sensor 274-1 is broken first at time t1b (dot 292-1b), the beam 284-3 of the third sensor 274-3 is broken next at time t2b (dot 292-2b), the beam of the third sensor 274-3 is then made at time t1m (dot 294-1m), and then the beam 284 of the first sensor 274-1 is made at time t2m (dot 294-2m).

As noted above with respect to FIG. 3F, the vacuum transport module 202 may be used with an exemplary six processing modules 240. Since a wafer 208 may be transported through the port 234 of any of the faces 232 of any of these processing modules 240, the three sensors 274 shown in FIGS. 3A and 3C may be provided on each of those faces 232. Therefore, during any transporting of a wafer 208 it is possible for an output of transition signals 286 to be generated from any of the processing modules 240.

Figure 5:
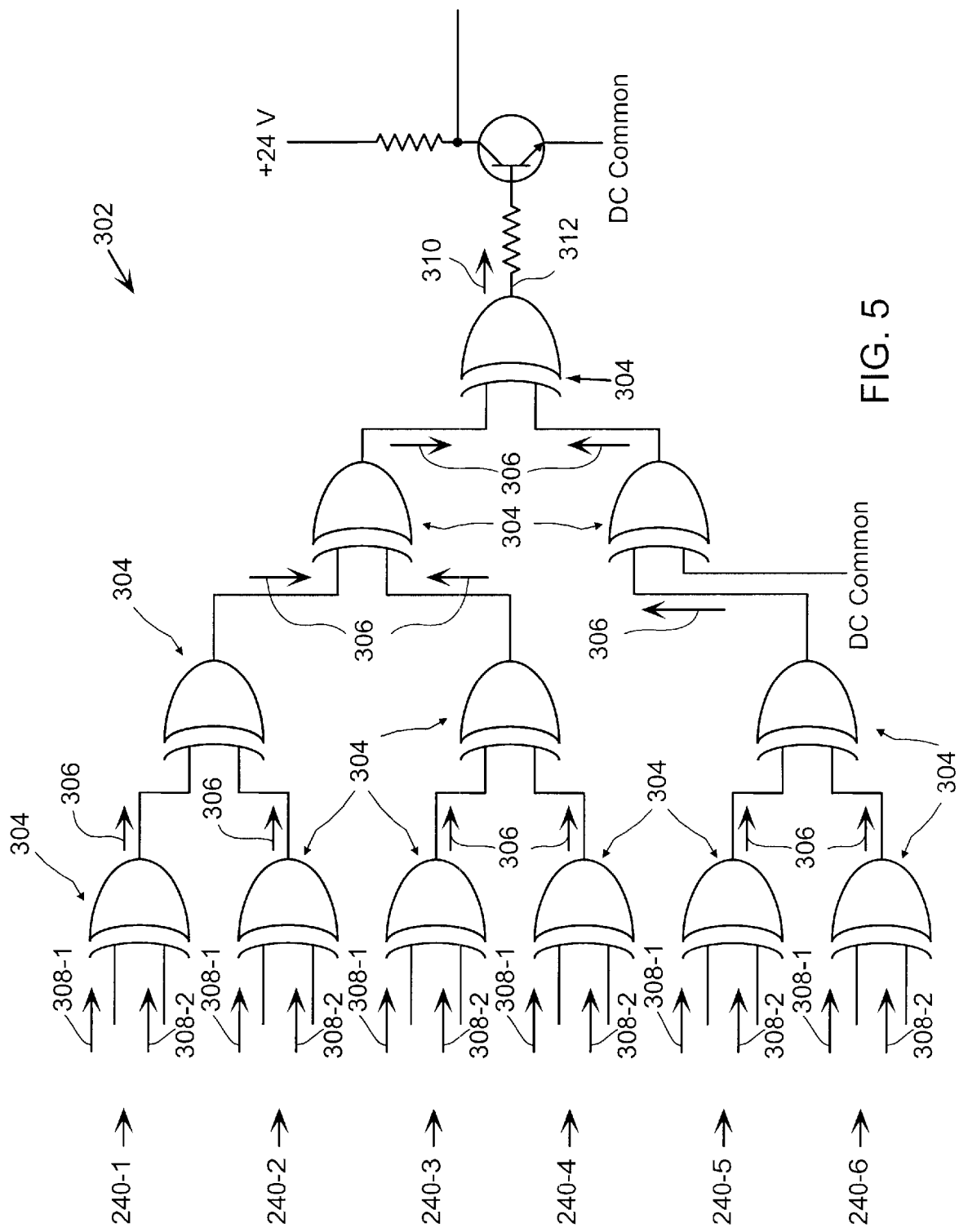
FIG. 5 is a schematic diagram of a logic circuit that provides one output signal per break and one output per make transition of the beams.

FIG. 5 is a schematic diagram of a logic circuit 302 in the form of an array of exclusive-or gates 304. An output 306 of each exclusive-or gate 304 is active if one or the other, but not both, of inputs 308 is active. In different terms, the output 306 is active if the inputs 308 are different. Circuit 302 has six pairs of the inputs 308, representing the outputs of each of the two active sensors 274 of each of the six faces 232 of the exemplary six processing modules 240. One of the inputs 308-1 may correspond to the output of the first sensor 274-1 of a first vacuum module 240-1, whereas another of the inputs 308-2 may correspond to the output of the second sensor 274-2 of that first vacuum module 240-1.

In a similar manner, the other inputs 308-1 and 308-2 of the other five modules 240-2 through 240-6 may be provided.

Figure 6A:
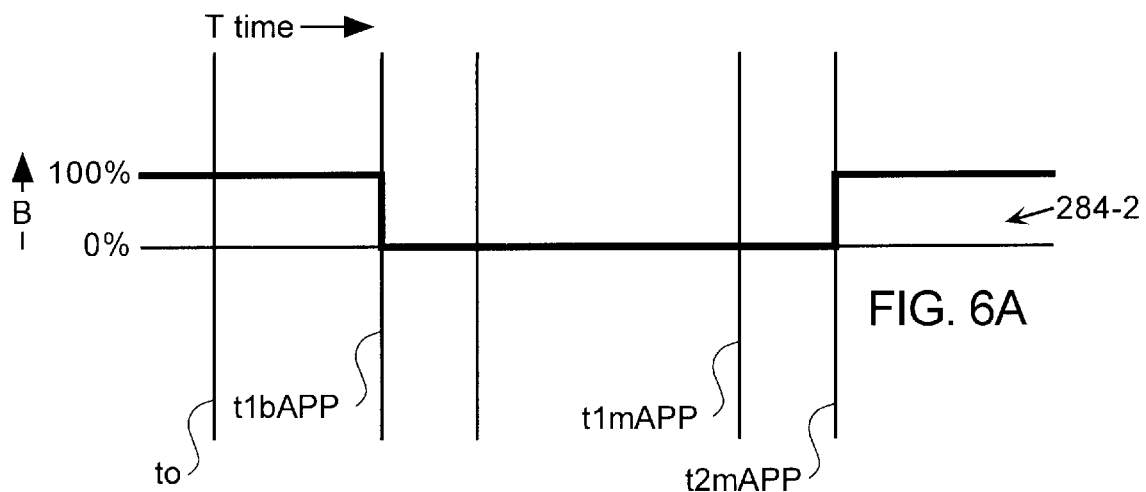
FIGS. 6A, 6B, and 6C respectively relate the timing of the beam break and make transitions for two sensors, to the one output signal from the logic circuit.
Figure 6B:
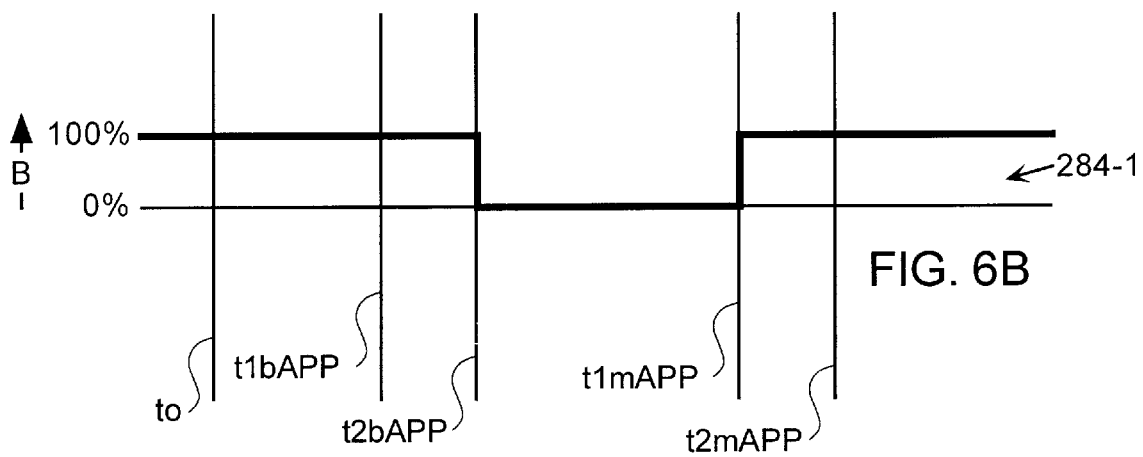
Figure 6C:
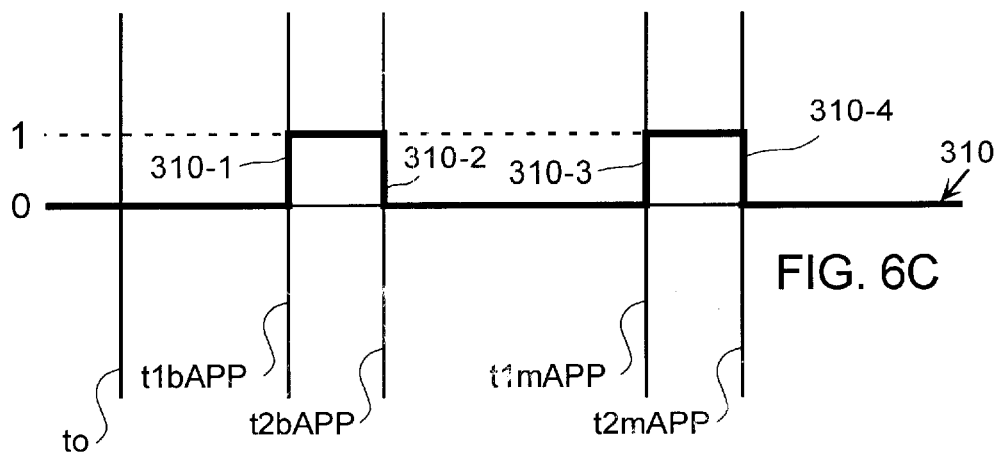

In response to an input transition signal 286 on only one of the inputs 308-1 or 308-2 of only one of the modules 240, a single signal 310 is generated by the logic circuit 302 on a main output 312. FIGS. 6A through 6C show that the single signal 310 transitions from a logical zero to a logical one whenever any of the input sensors 274-1 or 274-2 transitions in either direction. FIGS. 6A and 6B show the times of occurrence of the transitions of the beam 284 upon being broken or made by the moving wafer 208, and after the latency periods L have been eliminated. Depicting the same times, FIG. 6C shows the signal 310 as a binary output from the logic circuit 302 in response to the various transition signals 286 resulting from the breaking or making of the beam 284. In FIGS. 6A and 6B the time during the movement of the wafer 208 is on a T axis (left to right indicates increasing time) and the amount of the beam 284 (zero when blocked, 100% when made) transmitted to the receiver section 274R is shown on a B axis (down to up indicates increasing intensity).

In a typical sequence for determining possible wafer misalignment, at a time t0 the wafer 208-200 is moving at a controlled velocity toward the port 234 in the path 244. Both of the sensor beams 284-1 and 284-2 are unblocked, such that there is 100% of the respective beam 284-1 and 284-2 received by both of the receiver sections 274R. Further, no transition is indicated, and thus the value of the main signal 310 is logical-zero appearing at the main output 312.

At the time t1bAPP (also shown in FIG. 3B) corresponding to the apparent location of the sensor 274-2, there is the beam transition caused by the leading edge 254 of the wafer 208-200 breaking the beam 284-2 of the second sensor 274-2. The beam 284-2 of the second sensor 274-2 is shown in FIG. 6A going to a low intensity, a resulting transition signal 286 goes high (such that one input 308-1 is different from the other input 308-2) and at 310-1 the main output signal 310 goes to a binary one to represent this transition. FIG. 6B shows that the intensity of the beam 284-1 of the first sensor 274-1 continues at 100%. There is no beam 284-1 transition, hence no transition signal 286, and the wafer 208 continues to moving at a controlled velocity.

At time t2bAPP the leading edge 254 of the wafer 208-200 breaks the beam 284-1 of the first sensor 274-1, and there is a beam transition. The beam 284-1 of the first sensor 274-1 is shown going to a low intensity while the intensity of the beam 284-2 of the second sensor 274-2 stays low and the wafer 200-200 continues to move at the uniform velocity. The resulting transition signal 286 from the first sensor 274-1 goes positive. Because there is no transition sensed by the second sensor 274-2, the input 308-2 is different from the input 308-1, such that at 310-2 the main output signal 310 goes oppositely to a binary zero to represent this transition. The intensities of the beams 284-1 and 284-2 of the respective first and second sensors 274-1 and 274-2 continue low, there is no other transition signal 286, and the wafer 208-200 continues to move at the uniform velocity.

Time t1mAPP corresponds to the apparent location YMAPP of the first sensor 274-1 for the make transition. At time t1mAPP the trailing edge 296 of the wafer 208-200 makes the beam 284-1 of the first sensor 274-1, and there is the resulting beam transition. The resulting transition signal 286 from the first sensor 274-1 is applied to the one input 308-1, causing the main output signal 310 to go oppositely at 310-3 to a binary one to represent this transition. The beam 284-1 of the first sensor 274-1 is shown going to 100% while the intensity of the beam 284-2 of the second sensor 274-2 stays low and the wafer 208 continues to move at the uniformly velocity.

Time t2mAPP corresponds to the apparent location YMAPP of the second sensor 274-2 for the make transition. At time t2mAPP the trailing edge 296 of the wafer 208-200 makes the beam 284-2 of the second sensor 274-2, and there is the resulting beam transition. The resulting transition signal 286 from the second sensor 274-2 is applied to the input 308-2, causing the main output signal 310 to go oppositely at 310-4 to a binary zero to represent this transition. The beam 284-2 of the second sensor 274-2 is shown going to 100%, the intensity of the beam 284-1 of the first sensor 274-1 stays at 100% and the wafer 208-200 continues to move at the uniform velocity. At this juncture, the movement of the wafer 208-200 for wafer misalignment determination is complete and the system 272 awaits processing of data representing the location of the center 260 of the wafer 208-200 with respect to the center 264 of the blade 262.

Figure 7:
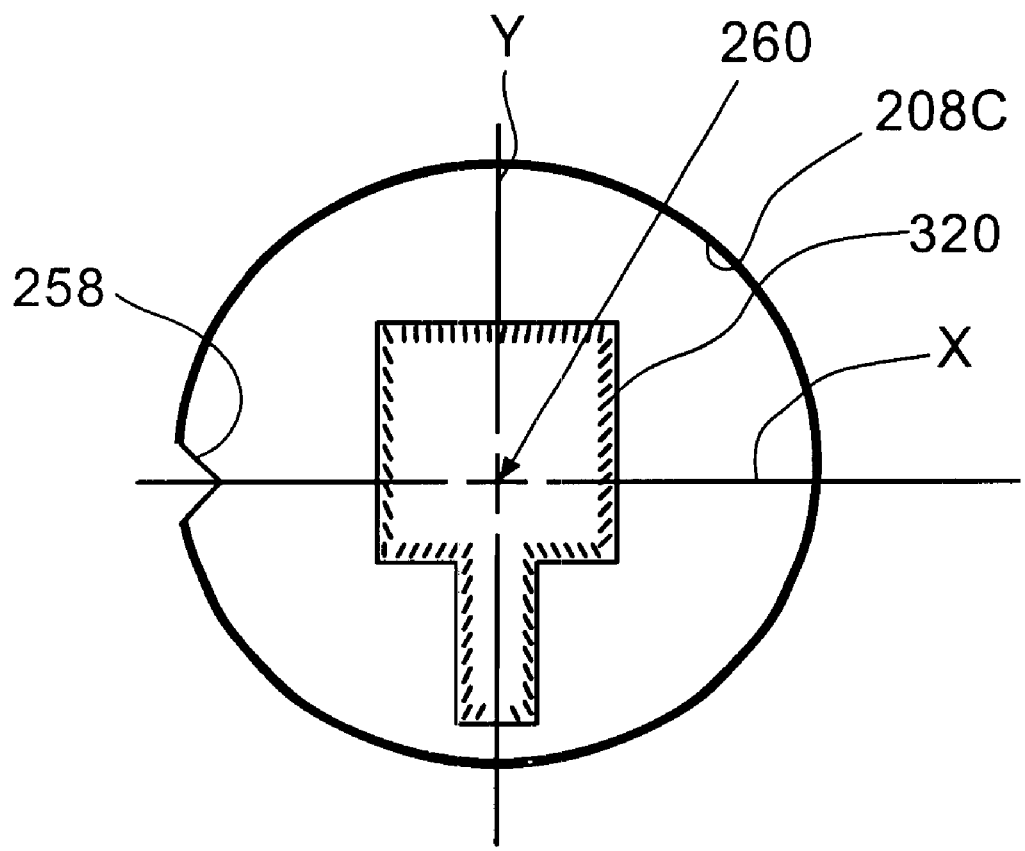
FIG. 7 is a bottom view of a calibration wafer used in a calibration process to accurately determine the location of the sensors.

The main output signal 310 described with respect to FIGS. 5 and 6C is used in conjunction with data as to the precise location of each of the sensors 274 for each of the modules 240. In detail, for every transition 310-1, 310-2, and 310-3 of the main output signal 310 the precise location of each of the sensors 274 is known. This location data is provided by a calibration method using a calibration wafer 208C having known physical characteristics. For example, the calibration wafer 208C shown in FIG. 7 may have a 200 mm diameter and a raised portion 320 on the bottom. The portion 320 is shaped to fit tightly in the open space, or pocket, 270 (FIG. 2B) of the blade 262. Use of the calibration method also assures that certain characteristics of the described apparatus are taken into consideration in providing data as to the precise location of the sensors 274 with respect to the robot 228. For example, the location of the axis 230 of the robot 228 may vary from one module 202 to the next. Also, there may be differences from one module 202 or 240 to the next in the latency periods LB and LM, such that the effective location of a particular sensor 274 in space may be slightly different than the actual location.

The calibration method starts with an operation of identifying whether an extension operation, or a retract operation, is to be performed, and identifying the particular module 240 to be calibrated. Next, there is an operation of clamping the calibration wafer 208C on the blade 262 with the raised portion 320 tightly in the pocket 270. The robot 228 is then given a command to "arm the capture function." This prepares the system 272 for the operation of the sensors 274. In a next operation the robot is commanded to move, as by retracting from the port 234 of the particular module 240 that is being calibrated. During the move, a record data operation records a value of a radius R and an angle Theta (T) based on the transition signals 286 from the sensors 274.

Figure 8:
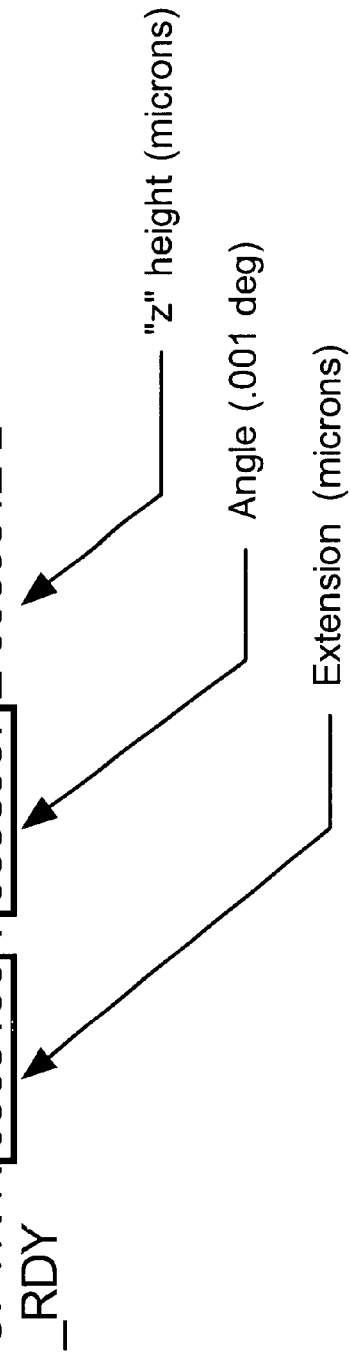
FIG. 8 depicts exemplary data resulting from the calibration process.

Typical values of R and T are shown in FIG. 8 for the retract move. The first three entries in FIG. 8 are not significant because they are not generated in response to the wafer 208C, whereas entries 4 through 7 are significant because they are generated when the wafer 208C passes the sensors 274. The typical data indicates that the height, or "Z" value, of the wafer 208C stays the same since the robot 228 moves the wafer 208C at a constant height. The typical data represents a face 232 of the module 240 similar to FIG. 3B in which the first sensor 274-1 is located at the distance 278 away from the wafer movement path 244, whereas the seconds sensor 274-2 is located at the distance 280 away from the path 244. The distance 278 is greater than the distance 280, so that as shown in FIG. 3B the second sensor 274-2 generates the first and last transition signals 286 (corresponding to data entries 4 and 7), and the first sensor 274-1 generates the second and third transition signals 286 (corresponding to data entries 5 and 6).

As shown in FIG. 8, the variation in the value of Theta was only 0.005 degrees, which is not significant. Since the variation of the Theta values is small for any normal extension or retraction, the average value is used in the calibration routine. In this example, the average value is 358.940 degrees.

It is to be understood that similar values of R and T are obtained for the extend move, and for efficiency of disclosure are not shown. The first four entries for the extend move are significant because they are generated in response to the wafer 208C passing the sensors 274, whereas the last three entries 5 through 7 are not significant. The typical extend data also indicates that the height, or "Z" value, of the wafer 208C stays the same since the robot 228 moves the wafer 208C at a constant height. The typical extend data also represents a face 232 of the module 240 similar to FIG. 3B in which the first sensor 274-1 is located at the distance 278 away from the wafer movement path 244, whereas the second sensor 274-2 is located at the distance 280 away from the path 244. The distance 278 is greater than the distance 280, so that as shown in FIG. 3B the second sensor 274-2 generates the first and last transition signals 286 (corresponding to data entries 1 and 4), and the first sensor 2741 generates the second and third transition signals 286 (corresponding to data entries 2 and 3).

Figure 9B:
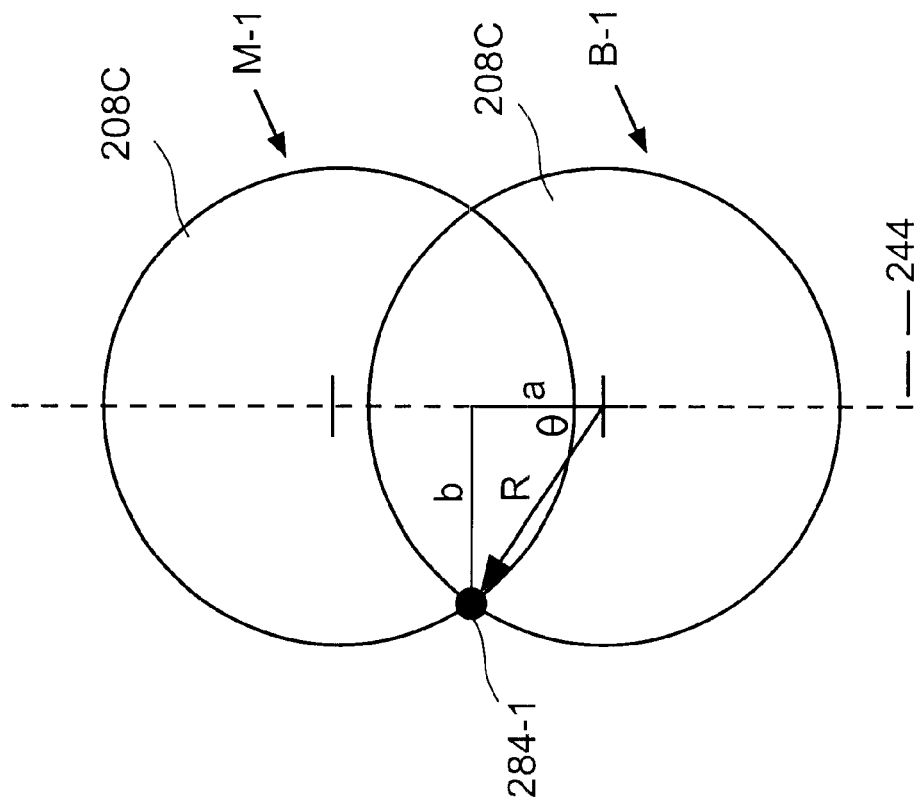
FIGS. 9A and 9B each depict two positions of a wafer during the calibration process, with FIG. 9A showing wafer position relative to a sensor beam that is on the right of a wafer path, and FIG. 9B showing wafer position relative to a sensor beam that is on the left of a wafer path.
Figure 9A:
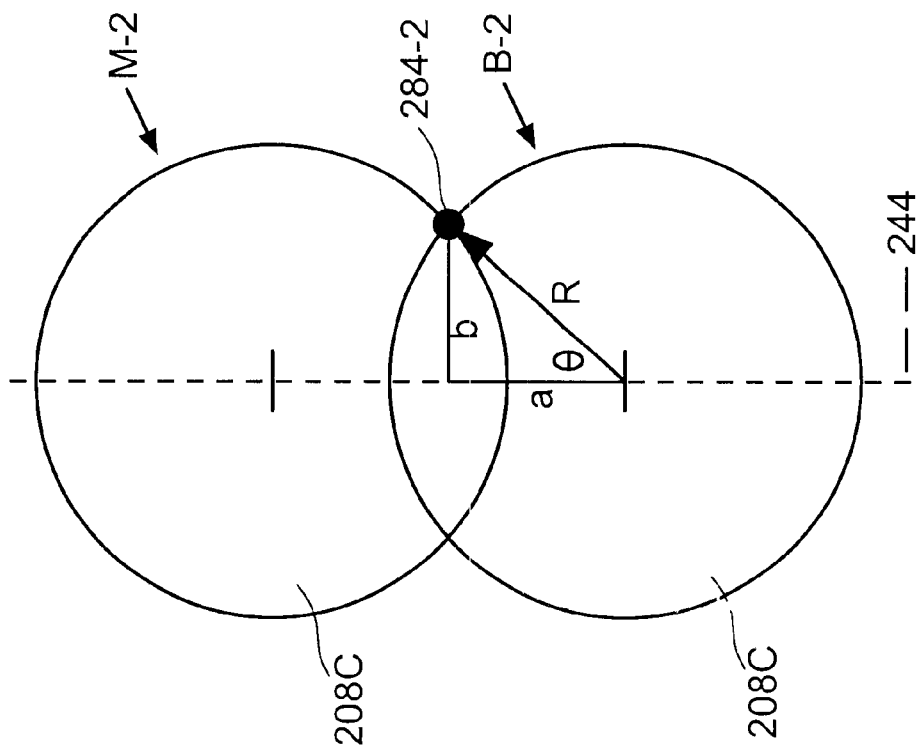

FIGS. 9A and 9B show four portions of the calibration wafer 208C along the path 244. In FIG. 9A the wafer 208C in position B-2 is just breaking the beam 284-2 of sensor 274-2. The wafer 208C in position M-2 is just making the beam 284-2 of the sensor 274-2. In FIG. 9B, the wafer 208C in position B-1 is just breaking the beam 284-1 of the sensor 274-1 and in position M-1 is just making the beam 284-1. Thus, FIGS. 9A and 9B show that the respective leading and trailing edges of the wafers 208C cause each beam 284 to transition. This information, along with the knowledge of the wafer radius (R) and the location of the robot 228 when the sensor 274 transitioned, allow the sensor location (center of aperture 283) to be determined. Considering the first and last transition and the data in FIG. 8, the difference between the location of the wafer center 260 when the beam 284 is first broken and when the beam 284 is remade is 513.210–363.106 or 150.104 millimeters (5.9096 in). Referring to FIG. 9A, this distance is 2$a$. Therefore, the value of $a$ is half the distance between the wafer centers or 2.9548 inches. The value of R is the wafer radius, 100 mm or 3.9370 inches. The distance b to the sensor 274 will be given by $$b = R \sin(\theta)$$

where $$\theta = \cos^{-1}(a/R)$$

Once $a$ and R are known, the sensor location may be expressed as global values. For example, the radius to the sensor location, $R_S$, is given by $$R_S = \sqrt{(R_T+a)^2 + b^2}$$

where $R_T$ is the captured value of the lower wafer position. The angle to the sensor, $\theta_S$, is given by $$\theta_S = \theta_T \pm \tan^{-1}[b/(R_T+a)]$$

where $\theta_T$ is the average angle (theta value) of the path. The ± sign is determined by the side of the path 244 that the sensor 274 is on. If the sensor 274 is on the left the sign is negative. If the sensor 274 is on the right the sign is positive.

The calibration results in accurate determinations of the locations of the sensors 274-1 and 274-2 in polar coordinates for each of the extend and retract movements, and with respect to the polar coordinate system of the robot 228, including the center 264, and for the particular arrangement of sensors 274 (i.e., spacings 278, 280, and 282).

A similar calibration is performed with respect to the third sensor 274-3. As noted, data representing the location of the sensors 274-1, 274-2, and 274-3 is stored in the register 292. With such accurate sensor locations available, each time the signal 310 is output to the robot controller 290 for a transition (e.g., 310-1), the signal 310 indicates the location of one of the edges 254, 256, and 296 of the wafer 208. In response to each such signal 310, the robot controller 290 stores data representing the position of the blade 262 at the time of the transition represented by that signal 310. The blade position data is output by encoders 322 driven by robot motors 324 and is stored in the register 292. Once the wafer alignment movement is complete, the controller 290 transmits the combined data (represented by the sensor locations and the corresponding blade positions) to a system controller 326. The system controller 326 serves as a data processor to provide an indication of the location of the center 260 of the wafer 208 with respect to the center 264 of the blade 262.

It may be understood, then, that the system 272 and the related method provide apparatus and a method of wafer alignment that operates while the wafer 208 is being transported without increasing the wafer transport time, that is, without reducing the controlled velocity, or the rate of transfer, of the wafer 208 among the modules 202 or 240 or the load locks 204. Such method and apparatus reduces the number of data processors per sensor 274 by requiring only one processor (controller 326) for the three sensors 274 at the same face 232. Due to the spacings 278, 280, and 282, and the circuit 302, that one processor is the only processor needed for determination of wafer misalignment in the entire cluster tool architecture 200. By the above-described calibration process, such method and apparatus also require less machining accuracy in locating the apertures 283 for the sensors 274, without sacrificing the accuracy of detections made using the sensors 274. As described, the latency periods LB and LM are also eliminated as sources of errors in using throughbeam sensors 274 to make wafer alignment determinations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Apparatus for generating data indicating the position of a wafer relative to a blade of a wafer transport robot as the blade continuously moves the wafer at a controlled rate of transfer along a path that extends through a plane defined by a facet of a module of semiconductor manufacturing equipment, a sensor positioning axis extending in the plane and intersecting the path, the apparatus comprising:

a first sensor mounted in the plane, on the positioning axis, and spaced from the path by a first distance so as to sense the wafer moving in the path; the first sensor having a latency period between a first time of sensing the wafer and a later time not earlier than the time of outputting a transition signal indicating the sensing of the wafer;

a second sensor mounted in the plane, on the positioning axis, and spaced from the path by a second distance so as to sense the wafer moving in the path; and the second distance being different from the first distance by an amount such that at the given rate the time between a first moment at which the wafer is sensed by the first sensor and a second moment at which the wafer is sensed by the second sensor is not less than the latency period.

2. Apparatus as recited in claim 1, wherein at each moment during the movement of the wafer the position of the robot is known; and wherein each of the sensors generates one of the transition signals in response to the respective sensor sensing the wafer; the apparatus further comprising:

a register on the robot for receiving data representing the position of the robot corresponding to a particular one of the transition signals, and a controller responsive to the particular one of the transition signals for causing the corresponding position of the robot to be stored in the register.

3. Apparatus as recited in claim 2, further comprising:

each of the sensors comprising a beam transmitter and a beam receiver, each of the sensors outputting one of the transition signals in response to the wafer breaking the respective beam or making the respective beam after such beam has been broken;

the difference between the first and second distances being effective to temporally separate all of the transition signals from the respective first and second sensors; and a processor for processing the temporally separate transition signals for input to the controller.

4. Apparatus as recited in claim 3, wherein the register is adapted to store, upon completion of one movement of the wafer through the plane and into or from the module, the position of the robot blade corresponding to two of the transition signals output from each of the sensors.

5. Apparatus as recited in claim 1, wherein the semiconductor equipment comprises a plurality of the planes, facets and modules and one of the sensor positioning axes is provided extending in each of the respective planes and one of the wafers may be moved along a separate one of the paths through any of the respective facets into or from any of the respective modules, the apparatus further comprising:

one of the first sensors being mounted in each of the respective planes of each of the respective modules, on the respective positioning axis, and spaced from the respective path by the first distance so as to sense the wafer moving in the respective path; the first sensor having a latency period between a first time of sensing the wafer in the respective path and a later time not earlier than an outputting of a transition signal indicating the sensing of the wafer in the respective path;

one of the second sensors being mounted in each of the respective planes of the respective modules, on the respective positioning axis, and spaced from the respective path by the second distance so as to sense the wafer moving in the respective path;

each of the respective second distances being different from the respective first distances by an amount such that at the given rate the time between a first moment at which the wafer in the respective path is sensed by the first sensor and a second moment at which the wafer in the respective path is sensed by the second sensor is not less than the latency period; and a logic circuit mounted on the robot for receiving all of the first and second transition signals from the respective first and second sensors, at the time of the movement of a particular one of the wafers along any respective path of any particular respective one of the modules the logic circuit being responsive to successive ones of the transition signals generated by sensing the particular wafer and identifying the particular respective module associated with the particular wafer.

6. Apparatus for generating data indicating the position of a wafer relative to a blade of a wafer transport robot as the blade moves the wafer along a path that extends through a plane defined by one of a plurality of facets of a plurality of modules of semiconductor manufacturing equipment, a sensor positioning axis extending in each of the planes and intersecting the respective path, the apparatus comprising:

a first sensor mounted in each of the planes, on the respective positioning axis, and spaced from the respective path by a first distance so as to sense the wafer moving in the respective path; the first sensor having a first latency period between a first time at which the first sensor senses the wafer in the respective path and a later time that is not earlier than a time at which the first sensor outputs a first transition signal indicating the sensing of the wafer in the respective path;

a second sensor mounted in each of the planes, on the respective positioning axis, and spaced from the respective path by a second distance so as to sense the wafer moving in the respective path; the second sensor outputting a second transition signal indicating the sensing of the wafer in the respective path;

for each second sensor with respect to each first sensor, the second distance being different from the first distance by an amount such that a first moment at which the wafer moving in the respective path is sensed by the first sensor, plus the first latency period, is not later in time than a second moment at which the wafer moving in the same respective path is sensed by the second sensor, so that before the second sensor senses the wafer in the respective path, the first transition signal is output by the first sensor in response to the first sensor sensing the wafer in the respective path, whereby there is temporal spacing of the first and second transition signals output by the respective first and second sensors; and a processor for successively receiving each of the first and second temporally spaced transition signals and separately processing each of such first and second temporally spaced transition signals.

7. Apparatus as recited in claim 6, wherein the one of the plurality of facets of the plurality of modules is an undetermined one of the facets, the apparatus further comprising:

a logic circuit receptive to all of the first and second temporally spaced transition signals regardless of which respective path corresponding to which respective facet is the path along which the wafer is traveling, the logic circuit outputting one signal regardless of which respective path corresponding to which respective facet is the path along which the wafer is traveling.

8. Apparatus as recited in claim 6, wherein the wafer is provided with either a flat edge or a notched edge positioned in a specific orientation, the apparatus further comprising:

each of the sensors being located on the positioning axis at a position other than that which corresponds to the position of the flat edge or the notched edge of the wafer so that as the wafer continuously moves along the respective path neither the flat edge nor the notched edge is sensed by either of the first or second sensors.

9. Apparatus as recited in claim 6, wherein:

each of the sensors comprising a beam emitter and a beam receiver, the emitter and the receiver being located on opposite sides of a respective one of the wafer paths so that the beam is either broken by a wafer moving along the respective path or once broken is made by a wafer moving along the respective path.

10. Apparatus as recited in claim 6, wherein the wafer may have one of many different sizes and the robot may cause the blade and the wafer carried by the blade to move in an extend motion through the respective plane into the respective module, or move in a retract motion through the respective plane from the respective module, the apparatus further comprising:

the second sensor being movably mounted in each of the planes and on the respective positioning axis, a second mounted position of the second sensor mounting the second sensor spaced from the respective path by a third distance so as to sense the wafer that moves in the respective path and that has a first one of the sizes; the second sensor outputting a third transition signal indicating the sensing of the wafer in the respective path;

for each second sensor mounted in the second position and with respect to each first sensor, the third distance being different from the first distance by an amount such that the first moment at which the wafer moving in the respective path is sensed by the first sensor, plus the latency period, is not later in time than a third moment at which the wafer moving in the same respective path is sensed by the second sensor mounted in the second position, so that before the second sensor mounted in the second position senses the wafer in the respective path, the first transition signal is output by the first sensor in response to the first sensor sensing the wafer in the respective path, whereby the first and third transition signals are output by the respective first and second sensors in temporal spacing; and a logic circuit receptive to all of the first and third temporally spaced transition signals regardless of which respective path corresponding to which respective facet is the path along which the wafer is traveling, the logic circuit outputting one signal regardless of which respective path corresponding to which respective facet is the path along which the wafer is traveling.

11. Apparatus for generating data indicating the position of a wafer relative to a blade of a wafer transport robot as the blade continuously moves the wafer along a path that extends through a plane defined by one of a plurality of facets of a plurality of modules of semiconductor manufacturing equipment, a sensor positioning axis extending in each of the planes and intersecting the respective path, the wafer having either of at least a first and a second physical characteristic, the robot causing the blade and the wafer carried by the blade to move in an extend motion through the respective plane into the respective module, or to move in a retract motion through the respective plane from the respective module, the apparatus comprising:

a first sensor mounted in each of the planes, on the respective positioning axis, and spaced from the respective path by a first distance so as to sense the wafer moving in the respective path; the first sensor having a first latency period between a first time at which the first sensor senses the wafer in the respective path and a later time that is not earlier than a time at which the first sensor outputs a first transition signal indicating the sensing of the wafer in the respective path;

a second sensor movably mounted in each of the planes and on the respective positioning axis, the second sensor being mountable in a first position spaced from the respective path by a second distance so as to sense the wafer moving in the respective path, the second sensor outputting a second transition signal indicating the sensing of the wafer in the respective path;

for each second sensor mounted in the first position with respect to each first sensor, the second distance being different from the first distance by an amount such that a first moment at which the wafer having the first physical characteristic and moving in the respective path is sensed by the first sensor, plus the first latency period, is not later in time than a second moment at which the wafer having the first physical characteristic and moving in the same respective path is sensed by the second sensor mounted in the first position, so that before the second sensor mounted in the first position senses the wafer in the respective path, the first transition signal is output by the first sensor in response to the first sensor sensing the wafer having the first physical characteristic and in the respective path, whereby for the wafer having the first physical characteristic the first and second transition signals are output by the respective first sensor and the second sensor mounted in the first position in temporal spacing; and the second sensor being mountable in a second position spaced from the respective path by a third distance so as to sense the wafer having the second physical characteristic and moving in the respective path; the second sensor mounted in the second position having a third latency period between a third time at which the third sensor senses the wafer in the respective path and a later time that is not earlier than a time at which the second sensor mounted in the second position outputs a third transition signal indicating the sensing of the wafer having the second physical characteristic and in the respective path, the last-mentioned second sensor outputting a third transition signal indicating the sensing of the wafer having the second physical characteristic and in the respective path;

for each last-mentioned sensor with respect to each first sensor, the third distance being different from the first distance by an amount such that a third moment at which the wafer having the second physical characteristic and moving in the respective path is sensed by the last-mentioned second sensor, plus the third latency period, is not later in time than a fourth moment at which the wafer having the second physical characteristic and moving in the same respective path is sensed by the first sensor, so that before the first sensor senses the wafer having the second physical characteristic and in the respective path, the third transition signal is output in response to the last-mentioned second sensor sensing the wafer having the second physical characteristic and in the respective path, whereby for the wafer having the second physical characteristic the first and third transition signals are output in temporal spacing.

12. Apparatus as recited in claim 11, wherein the wafers are moved by the robot completely through the respective facet so that a leading edge and a trailing edge of each wafer is sensed by each sensor; further comprising:

for a wafer having the first physical characteristic the temporal spacing of the transition signals being provided by the first transition signal in response to the first sensor sensing the leading edge of the wafer having the first physical characteristic, followed by the second transition signal in response to sensing the leading edge of the last-mentioned wafer, followed by a first trailing edge transition signal in response to the second sensor sensing the trailing edge of the last-mentioned wafer, followed by a second transition signal in response to the first sensor sensing the trailing edge of the last-mentioned wafer; and for a wafer having the second physical characteristic the temporal spacing of the transition signals being the third transition signal in response to the second sensor mounted in the second position sensing the leading edge of the wafer having the second physical characteristic, followed by the first transition signal in response to the first sensor sensing the leading edge of the last-mentioned wafer, followed by the a third trailing edge transition signal in response to the first sensor sensing the trailing edge of the last-mentioned wafer, followed by a fourth trailing edge transition signal in response to the second sensor mounted in the second position sensing the trailing edge of the last-mentioned wafer.

13. A method of calibrating a system that generates data indicating the position of a wafer relative to a blade of a wafer transport robot, the method comprising the operations of:

mounting the wafer transport robot adjacent to semiconductor manufacturing equipment having a port, the blade being movable by the robot through the port along a transport axis;

securing a calibration wafer to the blade at a position centered with respect to the blade, the calibration wafer having a known radius, the calibration wafer having a leading edge during movement of the blade carrying the calibration wafer, and a trailing edge during the movement;

providing a sensor at an unknown location on a port axis that extends in the port transverse to the transport axis, the sensor being in a position to be tripped first by the presence of the leading edge so that the sensor generates a first data item, the sensor being in a position to be tripped second by the absence of the wafer following the trailing edge so that the sensor generates a second data item;

causing the robot to move the calibration wafer on the transport axis and through the port past the sensor so that the sensor generates the first and second data items; and using the radius of the calibration wafer and the first and second data items to determine the distance from the transport axis of the unknown location of the sensor on the port axis.

14. A method as recited in claim 13, wherein:

the operation of providing a sensor further comprising providing at least two sensors spaced along the port axis, and further comprising:

mounting a first of the sensors on the port axis on one side of the wafer transport axis and spaced from the wafer transport axis by a first distance so as to sense the wafer moving along the wafer transport axis, the first sensor having a latency period between a first time of sensing the wafer and a later time of outputting a transition signal indicating the sensing of the wafer;

mounting a second of the sensors on the port axis on an opposite side of the wafer transport axis and spaced from the wafer transport axis by a second distance so as to sense the wafer moving along the wafer transport axis; and the mounting operations being performed such that the second distance is different from the first distance by an amount so that the time between a first moment at which the wafer is sensed by the first sensor and a second moment at which the wafer is sensed by the second sensor is not less than the latency period.

15. A method as recited in claim 13, wherein:

the operation of securing the calibration wafer to the blade further comprises orienting the calibration wafer on the blade with a notch or flat of the wafer positioned to avoid being sensed by the sensors.

16. A method as recited in claim 13, wherein:

the operation of capturing data as to the position of the calibration wafer comprises:

commanding the robot to arm for capturing data as to the position of the calibration wafer; and commanding the robot to move the calibration wafer through the port and past the sensors so that the sensors generate separate data items indicating the location of edges of the calibration wafer as the calibration wafer moves past the sensors.

17. A method as recited in claim 14, further comprising:

the operation of providing the sensors being effective to locate each of the at least two sensors spaced along the port on the transverse axis and relative to a center of the blade, one of the sensors being at a first distance from the center and another of the sensors being at a second distance from the center, the first and second distances being unequal and selected so as to temporally space the data item generated by the first sensor in response to the calibration wafer from the data item generated by the second sensor in response to the calibration wafer.

18. A method of providing data indicating the position of the center of a wafer with respect to the center of a blade carrying the wafer, the method comprising the operations of:

mounting the wafer on the blade for movement with the blade along a path;

providing a first sensor along a transverse axis that has a center at an intersection with the path, the first sensor being on one side of the center;

providing a second sensor along the transverse axis and on the other side of the center, the second sensor and the first sensor being spaced by a selected distance; and moving the wafer along the path so that the first sensor is triggered by the wafer and generates a temporally first transition signal and the second sensor is triggered by the wafer and generates a temporally second transition signal;

the selected distance being selected to temporally space the moments in time at which the first and second sensors are triggered by the wafer so that the temporally first transition signal is generated before the wafer triggers the second sensor.

19. A method as recited in claim 18, further comprising:

using the same processor, temporally first processing the first transition signal and then temporally second processing the second transition signal.

20. A method as recited in claim 18, wherein the blade may be at a blade position corresponding to the first transition signal and may be at a blade position corresponding to the second transition signal, further comprising:

temporally first storing the blade position corresponding to the temporally first transition signal and then storing the blade position corresponding to the temporally second transition signal.

21. A method as recited in claim 18, wherein:

the operations of providing the sensors comprising for each of the sensors providing a beam transmitter and a beam receiver, each of the sensors outputting one of the transition signals in response to the wafer breaking the respective beam or making the respective beam after such beam has been broken.

22. A method as recited in claim 18, further comprising:

mounting the blade for movement along any of a plurality of paths, each of the paths extending through a port of a different module of a semiconductor manufacturing equipment;

wherein a transverse axis extends along each port and is intersected at the center by a respective one of the paths;

the operations of providing the first and second sensors comprising:

providing one of the first sensors on each of the transverse axes so that a first one of the sensors is provided in each port, each such first sensor being on one side of the center;

providing one of the second sensors on each of the transverse axes so that a second one of the sensors is provided in each port, each such second sensor being on the other side of the center;

each second sensor and first sensor of a particular port being spaced by the selected distance; and the selected distance being selected to temporally space the moments in time at which the respective first and second sensors are triggered by the wafer so that the first transition signal is generated before the wafer triggers the second sensor.

23. A method of dynamically generating data indicative of the center of a substrate with respect to the center of a blade of a robot for transporting the substrate through one or more ports of a semiconductor manufacturing module, the method comprising the operations of:

defining an axis of each of the ports;

providing a plurality of sensors for a given one of the ports through which the substrate is to be moved by the blade along a path that intersects the axis of the port;

placing each of the plurality of sensors relative to the given port and on the axis according to a latency characteristic of the sensor so that the substrate moving through the port will be sensed by individual ones of the plurality of sensors at temporally-spaced times, the temporal spacing allowing a first of the sensors to sense the substrate and generate a first transition signal before a second of the sensors senses the substrate and generates a second transition signal; and causing the robot to move the blade and carry the substrate through the given port along the path so that the first of the sensors senses the substrate and generates a first transition signal corresponding to a first robot blade position and after the generation of the first transition signal a second of the sensors senses the substrate and generates a second transition signal corresponding to a second robot blade position.

24. A method as recited in claim 23, further comprising the operation of:

providing one processor for receiving, at temporally-spaced times, the first transition signal and the second transition signal.

25. A method as recited in claim 23, wherein the substrate has either a first diameter or a second diameter larger than the first diameter; and wherein the path intersects the axis at a point, the method further comprising the operations of:

the operation of providing a plurality of sensors comprising providing three sensors for each of the ports;

the operation of placing each of the plurality of sensors relative to the given port comprising placing a first of the sensors on the axis at a common location on one side of the point of intersection for sensing substrates having either the first or the second diameters;

the operation of placing each of the plurality of sensors relative to the given port comprising placing a second of the sensors on the axis at a second location on another side of the point of intersection and spaced by a first distance from the point for sensing only such substrates as have the first diameter;

the operation of placing each of the plurality of sensors relative to the given port being to place a third of the sensors on the axis at a third location on the other side of the point of intersection and spaced by a second distance from the point for sensing only such substrates as have the second diameter;

whereby the total distance from the common location to the second location, and the total distance from the common location to the third location is each selected according to the latency characteristic of the respective sensor so that the substrate having the first diameter and moving through the port will be sensed only by the first and second sensors, and so that the substrate having the second diameter and moving through the port will be sensed only by the first and third sensors, and whereby in the case of each of the substrates having the respective first or second diameters the sensing of the substrates is at such temporally-spaced times as respectively allow the first sensor to sense the respective substrate and generate the first transition signal before the second sensor senses the respective substrate and generates the second transition signal, and allow the third sensor to sense the respective substrate and generate a third transition signal before the first sensor senses the respective substrate and generates the first transition signal.

26. A method as recited in claim 25, further comprising the operation of:

identifying which of the one or more ports is the port having the respective first and second or first and third sensors that generated the first transition signal and the respective second transition signal or third transition signal.

27. A method as recited in claim 23, wherein:

the operation of providing a plurality of sensors for a given one of the ports comprises providing each of the sensors as a beam emitter and a beam receiver, the emitter and the receiver being spaced on opposite sides of a respective one of the paths so that the beam is either broken by a substrate moving along the respective path and into the beam, or is made by a substrate moving along the respective path and out of the beam;

the operation of placing the plurality of sensors relative to the given port and the resulting temporal spacing allows the beam of the first of the sensors to be broken by the substrate and generate the first transition signal before the beam of the second of the sensors is broken by the substrate and generates the second transition signal; and the temporal spacing further allows the beam of the second of the sensors to be made as the substrate moves out of the beam of the second of the sensors so that the second sensor generates a third transition signal corresponding to a third robot blade position and before the beam of the first of the sensors is made as the substrate moves out of the beam of the first of the sensors and generates a fourth transition signal corresponding to a fourth robot blade position.

28. A method as recited in claim 27, comprising the further operation of:

storing on the robot as a group the respective robot blade positions corresponding to the first, second, third and fourth transition signals.

29. A method as recited in claim 28, wherein the transporting of the substrate through the one or more ports is completed upon generation of the fourth transition signal, the method comprising the further operation of:

after completion of the transporting of the substrate, delivering the robot blade positions corresponding to the respective first, second, third and fourth transition signals as an indication of the center of the substrate with respect to the center of the blade of the robot.

* * * * *